US007387864B2

(12) United States Patent
Felder et al.

(10) Patent No.: US 7,387,864 B2
(45) Date of Patent: Jun. 17, 2008

(54) DONOR ELEMENT FOR THERMAL TRANSFER

(75) Inventors: Thomas C. Felder, Kennett Square, PA (US); Robert William Eveson, Cleveland (GB); Christopher Ferguson, Hartlepool (GB); James R. Joiner, Huddleston, VA (US); Moira Logan, Stockton-on-Tees (GB); Richard Paul Pankratz, Circleville, OH (US); Fredrick Claus Zumsteg, Jr., Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/665,616

(22) PCT Filed: Oct. 20, 2005

(86) PCT No.: PCT/US2005/038011

§ 371 (c)(1), (2), (4) Date: Apr. 17, 2007

(87) PCT Pub. No.: WO2006/045085

PCT Pub. Date: Apr. 27, 2006

(65) Prior Publication Data

US 2008/0003519 A1 Jan. 3, 2008

Related U.S. Application Data

(60) Provisional application No. 60/620,583, filed on Oct. 20, 2004.

(51) Int. Cl.
*G03F 7/34* (2006.01)
*G03F 7/11* (2006.01)

(52) U.S. Cl. .................... 430/200; 430/201; 430/271.1

(58) Field of Classification Search ................ 430/200, 430/201, 271.1
See application file for complete search history.

(56) References Cited

U.S. PATENT DOCUMENTS

| | | | |
|---|---|---|---|
| 4,695,288 | A | 9/1987 | Ducharme |
| 4,737,486 | A | 4/1988 | Henzel |
| 5,182,252 | A | 1/1993 | Nagasawa et al. |
| 5,223,328 | A | 6/1993 | Ito et al. |
| 5,387,496 | A | 2/1995 | DeBoer |
| 5,593,940 | A | 1/1997 | Umise et al. |
| 6,051,318 | A | 4/2000 | Kwon |
| 6,146,792 | A | 11/2000 | Blanchet-Fincher et al. |
| 6,190,757 | B1 | 2/2001 | Nelson et al. |
| 6,242,152 | B1 | 6/2001 | Staral et al. |

(Continued)

FOREIGN PATENT DOCUMENTS

EP 0 342 713 B1 11/1989

(Continued)

*Primary Examiner*—Richard Schilling
(74) *Attorney, Agent, or Firm*—Thomas H. Magee

(57) ABSTRACT

A donor element useful in an assemblage for imaging by exposure to light comprises a support layer formed by a stretching process, a light-to-heat conversion layer disposed adjacent the support layer containing a light absorber, and a transfer layer disposed adjacent the light-to-heat conversion layer opposite the support layer. The light-to-heat conversion layer is coated on the support prior to completion of the stretching process.

68 Claims, 3 Drawing Sheets

U.S. PATENT DOCUMENTS

| | | | |
|---|---|---|---|
| 6,485,884 | B2 | 11/2002 | Wolk et al. |
| 6,497,178 | B1 | 12/2002 | Rorke et al. |
| 6,548,148 | B1 | 4/2003 | Torii et al. |
| 6,689,538 | B2 | 2/2004 | Hoffend, Jr. et al. |
| 6,699,597 | B2 | 3/2004 | Bellmann et al. |
| 2002/0164535 | A1 | 11/2002 | Hoffend, Jr. et al. |
| 2002/0192588 | A1 | 12/2002 | Maejima et al. |

FOREIGN PATENT DOCUMENTS

| | | | |
|---|---|---|---|
| EP | 0492 411 | B1 | 7/1992 |
| EP | 0 603 566 | B1 | 6/1994 |
| EP | 0 874 030 | A2 | 10/1998 |

DONOR ELEMENT FOR THERMAL TRANSFER

This application is a Rule 371 of PCT/USO5/3801 1 filed Oct. 20, 2005 and claims benefit from provisional application 60/620,583 filed Oct. 20, 2004.

BACKGROUND OF THE INVENTION

1. Field of the Invention

This invention pertains to a donor element for use with a receiver element in an imageable assemblage for light-induced transfer of material from the donor element to the receiver element.

2. Description of Related Art

Donor elements for use with a receiver element in an imageable assemblage for light induced transfer of material from the donor element to the receiver element typically include multiple layers. The layers can include but are not limited to a support layer, a light-to-heat conversion (LTHC) layer, and a transfer layer. Typically a support layer such as a 50 μm polyethylene terephthalate film is sequentially coated with a LTHC layer precursor, the precursor is converted to a final LTHC layer by drying, and subsequently a transfer layer precursor is coated above the LTHC layer opposite the support layer and converted to a transfer layer by drying.

Materials can be selectively thermally transferred to form elements useful in electronic displays and other devices and objects. Specifically, selective thermal transfer of color filters, spacers, polarizers, conductive layers, transistors, phosphors and organic electroluminescent materials have all been proposed. Materials such as colorants can be selectively thermally transferred to form objects such as a proof copy of a reference image.

There remains a need for improvements in thermal transfer imaging donor elements in the effectiveness and selectivity of moving transferable material from a donor element, and in the effectiveness and selectivity of depositing and adhering and fixing transferred material to a receiver. Improvements in thermal transfer imaging donor elements that decrease unintended transfer of layers to a receiver element are sought. Improvements in thermal transfer imaging donor elements that improve the handling characteristics and damage resistance of the donor element are sought.

There remains a need for improvements to thermal transfer donor elements and improvements in their use with receiver elements in an imageable assemblage, in order to improve at least one of thermal transfer efficiency, independence of thermal transfer efficiency from any variation of heating, independence of thermal transfer efficiency from any variation of environmental conditions such as humidity and temperature, completeness of mass transfer, freedom from unintended mass transfer, clean separation of mass transferred and unimaged regions of the donor, and smoothness of the surface and edges of mass transferred material.

Films such as polyethylene terephthalate have long been coated with materials such as antistats and adhesion modifiers. There is a continuing need for improvements of formulations in this area to provide films with improved properties and utility.

Examples of known donor elements and their conventional use are described by U.S. Pat. No. 6,485,884 (Wolk, et al.) and U.S. Pat. No. 6,146,792 (Blanchet-Fincher, et al.).

U.S. Pat. No. 6,485,884 of Wolk, et al. provides a method for patterning oriented materials to make organic electronic displays or devices. The method includes selective thermal transfer of an oriented electronically active or emissive material from a thermal transfer donor sheet to a receptor. One method for providing an oriented light emitting polymer transfer layer is to coat an orientable light emitting polymer onto a donor sheet and to stretch the resulting transfer sheet in an orientation direction. In this method, the orientable light emitting polymer can be solubilized by addition of a suitable compatible solvent, and coated onto the donor sheet by spin-coating, gravure coating, mayer rod coating, knife coating and the like. The solvent chosen preferably does not undesirably interact with (e.g., swell or dissolve) any of the already existing layers in the donor sheet. The solvent can then be evaporated from the coating to make a fully formed donor sheet. The donor sheet can then be stretched or tentered in a selected direction to align the molecules of the orientable material of the transfer layer. This method may be suited to lamination transfer methods where an orientable transfer layer is coated onto a donor substrate, the composite article is stretched or tentered to orient the orientable transfer layer, and the transfer layer is transferred in its oriented state to a receptor by applying heat and/or pressure. In this way, the entire transfer layer, or large portion thereof, can be transferred in one exposure.

U.S. Pat. No. 6,146,792 of Blanchet-Fincher, et al. discloses donor elements comprising an ejection layer, a heating layer, and a transfer layer. The ejection layer can have additives, as long as they do not interfere with the essential function of the layer. Examples of such additives include coating aids, flow additives, slip agents, antihalation agents, antistatic agents, surfactants, and others which are known to be used in formulation of coatings.

SUMMARY OF THE INVENTION

The invention provides a donor element useful in an assemblage for imaging by heat generated from exposure to light. In one embodiment, the invention provides a donor element for use in a thermal transfer process comprising: a support layer formed by a stretching process; a light-to-heat conversion layer disposed adjacent the support layer containing a light absorber; and a transfer layer disposed adjacent the light-to-heat conversion layer opposite the support layer after the stretching process, the transfer layer comprising a material capable of being image-wise transferred from the donor element to an adjacent receiver element when the donor element is selectively exposed to imaging light; wherein the light-to-heat conversion layer is coated on the support layer prior to completion of the stretching process.

BRIEF DESCRIPTION OF THE DRAWING(S)

FIG. 4A illustrates the imageable assemblage being imaged by light.

DETAILED DESCRIPTION OF THE PREFERRED EMBODIMENTS

Figure 1:
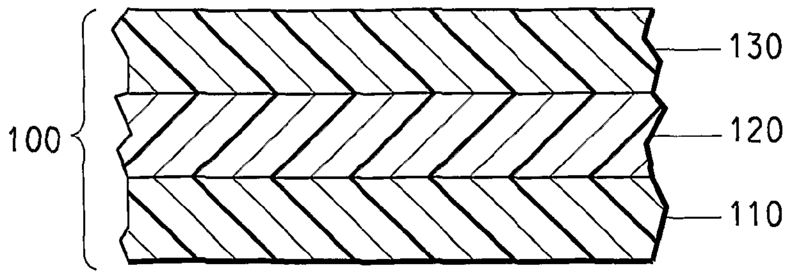
FIG. 1 is a schematic cross-section of one embodiment of a donor element comprising a light-to-heat conversion layer that has been stretched.

FIG. 1 shows a donor element 100 comprising a support layer 110, a light-to-heat conversion (LTHC) layer 120, and a transfer layer 130. The support layer and transfer layer sandwich the light-to-heat conversion layer; this donor element therefore includes a support layer, having an adjacent light-to-heat conversion layer on one side, and a transfer layer adjacent the light-to-heat conversion layer and opposite the support layer.

In the present invention, the light-to-heat conversion layer is stretched simultaneously with the support layer. The stretching is carried out before the adjacent transfer layer is introduced. The stretching of the light-to-heat conversion layer introduces unexpected benefits in the performance of the donor element when imaged in an imageable assemblage. Donor elements may optionally include other layers, for example disposed between the support layer and the transfer layer (e.g. an interlayer), adjacent the support layer opposite the LTHC layer (e.g. an antistatic layer), and adjacent the transfer layer opposite the LTHC layer (e.g. an adhesive layer).

The support layer 110 provides a practical means of handling the donor element with its functional layers, for example during manufacturing, in making the imageable assemblage, and in removing the spent donor element from the imaged receiver element after imaging of the assemblage. In such aspects, the support layer is conventional, acting as a substrate for layers that may be substantially changed during imaging.

The support layer 110 can be a polymer film. One suitable type of polymer film is a polyester film, for example, polyethylene terephthalate or polyethylene naphthalate films. However, other films with sufficient mechanical and thermal stability for the particular application, and optionally sufficient optical properties, including high transmission of light at a particular wavelength, can be used. Examples of suitable polymers for a support layer include polycarbonate, polyolefin, polyvinyl resin, or polyester. In one embodiment, synthetic linear polyester is used for the support layer.

The synthetic linear polyesters useful as the support layer may be obtained by condensing one or more dicarboxylic acids or their lower alkyl (up to 6 carbon atoms) diesters, eg terephthalic acid, isophthalic acid, phthalic acid, 2,5-, 2,6- or 2,7-naphthalenedicarboxylic acid, succinic acid, sebacic acid, adipic acid, azelaic acid, 4,4'-diphenyldicarboxylic acid, hexahydro-terephthalic acid or 1,2-bis-p-carboxyphenoxyethane (optionally with a monocarboxylic acid, such as pivalic acid) with one or more glycols, particularly an aliphatic or cycloaliphatic glycol, e.g. ethylene glycol, 1,3-propanediol, 1,4-butanediol, neopentyl glycol and 1,4-cyclohexanedimethanol. An aromatic dicarboxylic acid is preferred. An aliphatic glycol is preferred. Polyesters or copolyesters containing units derived from hydroxycarboxylic acid monomers, such as ω-hydroxyalkanoic acids (typically C3-C12) such as hydroxypropionic acid, hydroxybutyric acid, p-hydroxybenzoic acid, m-hydroxybenzoic acid, or 2-hydroxynaphthalene-6-carboxylic acid, may also be used. In one embodiment, the polyester is selected from polyethylene terephthalate and polyethylene naphthalate.

The support layer may comprise one or more discrete layers of the above film-forming materials. The polymeric materials of the respective layers may be the same or different. For instance, the support layer may comprise one, two, three, four or five or more layers and typical multi-layer structures may be of the AB, ABA, ABC, ABAB, ABABA or ABCBA type.

Formation of the support layer may be accomplished by conventional techniques. Conveniently, formation of the support layer is effected by extrusion. In general terms the process may comprise the steps of extruding a layer of molten polymer, quenching the extrudate and orienting the quenched extrudate in at least one direction.

The support layer may be unoriented, or oriented any number of times, for example uniaxially-oriented, or biaxially oriented. Orientation may be effected by any process known in the art for producing an oriented film, for example a tubular or flat film process. Typically, the process used to orient the support layer provides sufficient stretching to produce a stretched light-to-heat conversion layer of the present invention. The stretching is to the extent of at least 10% of at least one dimension of the unstretched dimension. In one embodiment, the stretching in one dimension is at least a selection of 10, 20, 50, 100, 200, 400, 800, 1600, and 3200%. In one embodiment, the stretching is less than a selection of 6400, 3200, 1600, 800, 400, 200, 100, and 50%.

Biaxial orientation may be effected by drawing in two mutually perpendicular directions in the plane of the film to achieve a satisfactory combination of mechanical and physical properties.

Simultaneous biaxial orientation may be effected by extruding a thermoplastics polymer tube which is subsequently quenched, reheated and then expanded by internal gas pressure to induce transverse orientation, and withdrawn at a rate which will induce longitudinal orientation.

The support layer-forming polymer may be extruded through a slot die and rapidly quenched upon a chilled casting drum to ensure that the polymer is quenched to the amorphous state. Orientation then may be effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate may be conveniently effected over a set of rotating rolls or between two pairs of nip rolls, transverse stretching then being effected in a stenter apparatus. Alternatively, the cast film may be stretched simultaneously in both the forward and transverse directions in a biaxial stenter. Stretching is effected to an extent determined by the nature of the polymer, for example polyethylene terephthalate is usually stretched so that the dimension of the oriented film is from 2 to 5, more preferably 2.5 to 4.5, times its original dimension in each direction of stretching. Typically, stretching is effected at temperatures in the range of 70 to 125° C. Greater draw ratios (for example, up to about 8 times) may be used if orientation in only one direction is required. It is not necessary to stretch equally in each direction although this is common.

A stretched film may be dimensionally stabilised by heat-setting under dimensional restraint at a temperature above the glass transition temperature of the polyester but below the melting temperature thereof, to induce crystallisation of the polyester. The actual heat-set temperature and time will vary depending on the composition of the film but should be selected so as to not substantially degrade the mechanical properties of the film. Within these constraints, a heat-set temperature of about 135° to 250° C. is generally desirable for polyester terephthalate. The thermal stability of the components in the coating layer may require careful control of the heat-set temperature in order to avoid or reduce any degradation of those components. Preferably, the heat-set temperature is less than about 235° C.

Where the support layer itself comprises more than one layer, preparation of the support layer may be conveniently effected by coextrusion, either by simultaneous coextrusion of the respective film-forming layers through independent orifices of a multi-orifice die, and thereafter uniting the still molten layers, or, alternately, by single-channel coextrusion in which molten streams of the respective polymers are first united within a channel leading to a die manifold, and thereafter extruded together from the die orifice under conditions of streamline flow without intermixing thereby to produce a multi-layer polymeric film, which may be oriented and heat-set as herein described. Formation of a multi-layer support layer may also be effected by conventional lamination techniques, for example by laminating together a preformed first layer and a preformed second layer, or by casting, for example, the first layer onto a preformed second layer.

The support layer is typically thin and coatable so that uniform coatings can be conveniently applied and concentrated into subsequent layers, and the final multilayer donor element can be conveniently handled in sheet or roll form. The support layer composition is also typically selected from materials that remain stable despite heating of the LTHC layer during imaging. The typical thickness of the support layer may range from 0.005 to 0.5 mm, for example 15 μm, 25 μm, 50 μm, 100 μm, or 250 μm thick film, although thicker or thinner support layers may be used. The width and length dimensions of the support layer are choosen for handling convenience and dimensions of the receiver element to be imaged, for example a width of 0.1 to 5 m, and a length of 0.1 to 10,000 m.

The materials used to form the outmost surfaces of the support layer that contact the closest adjacent layer (e.g., an underlayer or a LTHC layer) can be selected to improve adhesion between the support layer and the adjacent layer, to control temperature transport between the support layer and the adjacent layer, to control imaging light transport to the LTHC layer, to improve handling of the donor element, and the like. An optional priming layer can be used to increase uniformity during the coating of subsequent layers onto the support layer and also increase the bonding strength between the support layer and adjacent layers. One example of a suitable support layer with primer layer is available from Teijin Ltd. (Product No. HPE100, Osaka, Japan).

The support layer may be plasma treated to accept an adjacent contiguous layer, such as the MELINEX® line of polyester films made by DuPontTeijinFilms®, a joint venture of DuPont and Teijin Limited. Backing layers on the side of the support opposite the transfer layer may optionally be provided on the support. These backing layers may contain fillers to provide a roughened surface on the back side of the support layer, i.e. the side opposite from the transferable layer. Alternatively, the support layer itself may contain fillers, such as silica, to provide a roughened surface on the back side of the support layer. Alternately, the support layer may be physically roughened to provide a roughened surface on one or both surfaces of the support layer. Some examples of physical roughening methods include sandblasting, impacting with a metal brush, etc. A light attenuated layer may result from a roughened support layer surface or surface layer which can also include a light attenuating agent such as an absorber or diffuser.

The support layer may contain any of the additives conventionally employed in the manufacture of polymeric films, such as voiding agents, lubricants, anti-oxidants, radical scavengers, UV absorbers, fire retardants, thermal stabilisers, anti-blocking agents, surface active agents, slip aids, optical brighteners, gloss improvers, prodegradents, viscosity modifiers and dispersion stabilisers. Fillers are particularly common additives for polymeric film and useful in modulating film characteristics, as is well-known in the art. Typical fillers include particulate inorganic fillers (such as metal or metalloid oxides, clays and alkaline metal salts, such as the carbonates and sulphates of calcium and barium) or incompatible resin fillers (such as polyamides and polyolefins) or a mixture of two or more such fillers, as are well-known in the art and described in WO-03/078512-A for example. The components of the composition of a layer may be mixed together in a conventional manner. For example, by mixing with the monomeric reactants from which the layer polymer is derived, or the components may be mixed with the polymer by tumble or dry blending or by compounding in an extruder, followed by cooling and, usually, comminution into granules or chips. Masterbatching technology may also be employed.

The support layer is preferably unfilled or only slightly filled, i.e. any filler is present in only small amounts, generally not exceeding 0.5% and preferably less than 0.2% by weight of the support layer polymer. In this embodiment, the support layer will typically be optically clear, preferably having a percentage of scattered visible light (haze) of <6%, more preferably <3.5% and particularly <2%, measured according to the standard ASTM D 1003.

Metallized films can be used as a support layer for a donor element. Specific examples include single or multilayer films comprising polyethylene terephthalate or polyolefin films. Useful polyethylene terephthalate films include MELINEX® 473 (100 μm thickness), MELINEX® 6442 (100 μm thickness), MELINEX® LJX111 (25 μm thickness), and MELINEX® 453 (50 μm thickness), all metallized to 50% visible light transmission with metallic chromium by CP Films, Martinsville, Va.

The support layer is usually reasonably transparent to the imaging light that can impinge on it prior to reaching the LTHC layer, for example a support layer having a light transmittance at the imaging wavelengths of 90% or more. The support layer can be a single layer or a multilayer. Also, an antireflection layer may be formed on the support layer to reduce light reflection.

The light-to-heat conversion layer 120 acts during the imaging step to convert light absorbed by one or more light absorbers to thermal energy in at least the LTHC layer, that thermal energy being sufficient to cause transfer of some component or a volume of the transfer layer to a receiver element of the assemblage described later.

In the present invention, the light-to-heat conversion layer is applied to the support layer prior to the completion of the stretching step applied to the support layer.

Typically, a light absorber in the LTHC layer absorbs light in the infrared, visible, and/or ultraviolet regions of the electromagnetic spectrum and converts the absorbed light into heat. The light absorber is typically highly absorptive of the selected imaging light, providing a LTHC layer with an absorbance at the wavelength of the imaging light in the range of about 0.1 to 3 or higher (approximately absorption of 20 to 99.9% or more of incident light at a specific wavelength). Typically the absorbance of the LTHC layer at the wavelength of the imaging light is around 0.1, 0.2, 0.3, 0.4, 0.6, 0.8, 1.0, 1.25, 1.5, 2, 2.5, or 10 or somewhere in between. Absorbance is the absolute value of the logarithm (base 10) of the ratio of a) the intensity of light transmitted through the layer (typically in the shortest direction) and b) the intensity of light incident on the layer. For example, an absorbance of 1 corresponds to transmission of 10% of incident light intensity; an absorbance of greater than 0.4 corresponds to transmission of less than approximately 40% of incident light intensity.

An absorbance maximum between two wavelengths refers to the absorbance at a wavelength where the absorbance is the largest value found in the range of wavelengths, and first derivative of the absorbance versus wavelength passes through zero, and the second derivative is negative—in other words, nearest adjacent values by wavelength of the absorbance are smaller or the same, and no larger value of absorbance is found over the wavelength range.

In one embodiment, although the LTHC layer is highly absorptive of light in the wavelength region or specific wavelength used for imaging, the LTHC layer is much less adsorptive (e.g. transparent, semitransparent, or translucent) in another wavelength region or specific wavelength. For example, a LTHC layer imaged with a laser having maximum output around 830 nm can have a absorbance maximum in the wavelength region from 750 to 950 nm, while simultaneously having a absorbance maximum in the region from 400 to 750 nm that is at least 5 times smaller (e.g., the highest absorbance from 750 to 900 nm is at 840 nm, and is 0.5, while the highest absorbance from 400 to 750 is at 650 nm, and is 0.09). In one embodiment, this regional ratio of absorbance of the imaging region to the non-imaging region typically will be greater than 1 so that the non-imaging region is relatively transparent; for example a ratio greater than a selection from 2, 4, 8, 12, 16, 32, or greater. This ratio of absorbance at given wavelength regions can be applied to the LTHC layer, and also to any significant absorber in the LTHC layer (for example, any specific absorber such as one accounting for at least 10% of the absorption of the imaging light can be characterized by the ratio, e.g. 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid having CAS No. [162411-28-1]).

In one embodiment, the LTHC layer is notably absorptive of light at certain imaging wavelengths, but is notably transmissive of light at some other wavelength. For example in one prophetic embodiment, while absorbing 90% of light at 832 nm in wavelength (absorbance 1 at a wavelength used for imaging by an infrared laser), only 20.6% of light at 440 nm in wavelength would be absorbed (absorbance 0.10, at a blue wavelength), allowing the donor to transmit far more light at a visible wavelength than at a imaging wavelength of the infrared. The ratio of absorbance (imaging wavelength to other wavelength) in that case is 10. Transmission at the other wavelength need not be complete, but should be improved; an absorbance ratio varying from as low as 3 to as high as 100, or higher, can be useful. For example in visual inspections, a ratio favoring a visible wavelength for the selectively transmitted wavelength, selected from ratios of 5, 10, 15, 30, and 60 or higher should be useful. Useful wavelengths for transmission of light through a LTHC layer include 300 and 350 nm in the ultraviolet spectrum, 400, 450, 500, 550, 600, 650, 670, 700, and 750 nm in the visible spectrum, and 770, 800, 850, 900, 1000, and 1200 nm in the infrared spectrum. Useful wavelengths for absorbance to generate heat include wavelengths such as 671, 780, 785, 815, 830, 840, 850, 900, 946, 1047, 1053, 1064, 1313, 1319, and 1340 nm, corresponding to laser output wavelengths. A layer transmitting 20% or more of light at a given wavelength can be said to be (relatively) transparent at that wavelength. Transparency improves as transmission increases, e.g. from 20 to 30 to 40 to 50 to 60 to 70 to 80 to 90 to 95% or higher transmission at a given wavelength, transparency improves in a LTHC layer. Scattering of light should also be minimized to improve transparency by minimizing backscatter and scattering losses.

The use of a highly absorptive material for the imaging radiation allows a very thin LTHC layer to be constructed. Stretching also can produce a very thin layer. A thin LTHC layer can be useful in producing high localized temperatures by light absorption. In one embodiment, the thickness of the LTHC layer is equal to or less than 500 nm in thickness. Other useful thicknesses include less than or equal to 400 nm, 300 nm, 200 nm, 150 nm, 100 nm, 75 nm, 50 nm, and 30 nm. Thicker layers can also be used, commonly up to about 5 μm in thickness.

In one embodiment, the thickness of a typical light-to-heat conversion layer ranges from 50 nm to 250 μm, although thickness is easily optimized by experiment and can be less important than the light absorption properties of the layer. Very thin films may not achieve a suitably high amount of light absorption. The thickness is typically varied according to the concentration and effectiveness of the light absorbers present so as to achieve a manageable amount of thermal energy and temperature during the imaging process, so as to achieve the necessary transfer of material without deleterious side effects.

It is often useful to choose a light absorber for the light-to-heat conversion layer that can absorb a significant amount of light with only a thin layer. For example, if a layer of 0.2 μm has an absorbance of 0.2 for light at 830 nm, the layer can be said to have an optical density of 1/μm, at 830 nm. In one embodiment, the light-to-heat conversion layer has at least one optical density between two choices from 0.01, 0.1, 0.5, 1.0, 2.0, 4, 8, 16, 32, 64, and 125/μm at a wavelength between 750 and 1400 nm. Alternately, a suitable amount of light can be absorbed rather than transmitted, with transmittance being as low as a selection from 10, 20, 30, 40, and 50%, and as high as a higher amount of transmittance selected from 60, 70, 80, and 90%.

In one embodiment, the light absorber or combination of light absorbers in the light-to-heat conversion layer contributes more than 0.1 units of the absorbance for at least one wavelength in at least one of the visible, short wavelength mid infrared, and long wavelength mid infrared wavelength bands of light.

The LTHC layer, the release-modifier layer, or their precursors may be applied by any suitable technique for coating a material such as, for example, bar coating, gravure coating, extrusion coating, vapor deposition, lamination and other such techniques.

In one embodiment, a layer precursor or precursors such as the LTHC layer and/or release-modifier layer precursor is applied to a support layer precursor and the resulting combination is stretched while optionally held at elevated temperature, resulting in a thinning and possibly axial molecular orientation of the support layer and the adjacent layer(s) in the axis of the stretching, and often improved adhesion between immediately adjacent layers. The thinning is useful for improved heat management and for providing very thin layers. Orientation can provide higher strength, higher adhesion of layers, and anisotropic interaction with light.

Orientation of the layers may be analyzed by conventional techniques such as characterization of infrared birefringence, surface optical second harmonic generation, sum frequency generation, ellipsometry, or related analytical methods. Thickness of the layers can be investigated by conventional techniques such as fracture and electron microscopy, or ellipsometry.

Stretching of the LTHC layer can occur before or after application of the subsequent layers of the donor element, such as the transfer layer. For example, stretching of the LTHC layer can be incorporated into manufacturing of a support layer and LTHC layer composite intermediate during donor element manufacture, and a single composite intermediate can then be shipped to a coating facility with single component coaters and be utilized with numerous different, later applied, transfer layers to form different donor elements. This allows for economies of scale in manufacture of the composite intermediate that is later divided and used to support a variety of different transfer layers.

Another advantage of finishing the stretching of the LTHC layer prior to application of the transfer layer is that the transfer layer need not be robust to stretching, and is not thinned, allowing more flexibility in transfer layer selection and design.

Suitable light absorbing materials for the LTHC layer can include, for example, dyes (e.g., visible dyes, ultraviolet dyes, infrared dyes including near infrared dyes, fluorescent dyes, and radiation-polarizing dyes), pigments, metals, metal compounds, metal films, and other suitable absorbing materials.

Dyes suitable for use as light absorbers in a LTHC layer may be present at least in part (>5%) in dissolved form, or in at least partially dispersed form, rather than practically entirely (>80%) in a particulate form as for pigments. In one embodiment, the light absorber most responsible for the absorbance at the imaging wavelengths is a dye completely or partially (>5%) dissolved in the LTHC layer. In one embodiment, the light absorber most responsible for the absorbance at the imaging wavelengths is practically dissolved (>80%) in a formulation when applied to the donor element construction, and becomes partially dispersed later.

Examples of dyes and pigments suitable as light absorbers in a light-to-heat conversion layer include polysubstituted phthalocyanine compounds and metal-containing phthalocyanine compounds; metal-complex compounds, benzoxazole compounds, benz[e,f, or g]indolium compounds, indocyanine compounds, cyanine compounds; squarylium compounds; chalcogenopyryloacrylidene compounds; croconium and croconate compounds; metal thiolate compounds; bis(chalcogenopyrylo) polymethine compounds; oxyindolizine compounds; indolizine compounds; pyrylium and metal dithiolene compounds, bis(aminoaryl) polymethine compounds; merocyanine compounds; thiazine compounds; azulenium compounds; xanthene compounds; and quinoid compounds. Light absorbing materials disclosed in U.S. Pat. No. 5,108,873, "IR-ray absorptive compound and optical recording medium by use thereof"; U.S. Pat. No. 5,036,040, "Infrared absorbing nickel-dithiolene dye complexes for dye-donor element used in laser-induced thermal dye transfer"; U.S. Pat. No. 5,035,977, "Infrared absorbing oxonol dyes for dye-donor element used in laser-induced thermal dye transfer"; U.S. Pat. No. 5,034,303, "Infrared absorbing trinuclear cyanine dyes for dye-donor element used in laser-induced thermal dye transfer"; U.S. Pat. No. 5,024,923, "Infrared absorbent compositions"; U.S. Pat. No. 5,019,549, "Donor element for thermal imaging containing infra-red absorbing squarylium compound"; U.S. Pat. No. 5,019,480, "Infrared absorbing indene-bridged-polymethine dyes for dye-donor element used in laser-induced thermal dye transfer"; U.S. Pat. No. 4,973,572, "Infrared absorbing cyanine dyes for dye-donor element used in laser-induced thermal dye transfer"; U.S. Pat. No. 4,952,552, "Infrared absorbing quinoid dyes for dye-donor element used in laser-induced thermal dye transfer"; U.S. Pat. No. 4,950,640, "Infrared absorbing merocyanine dyes for dye-donor element used in laser-induced thermal dye transfer"; U.S. Pat. No. 4,950,639, "Infrared absorbing bis(aminoaryl)polymethine dyes for dye-donor element used in laser-induced thermal dye transfer"; U.S. Pat. No. 4,948,778, "Infrared absorbing oxyindolizine dyes for dye-donor element used in laser-induced thermal dye transfer"; U.S. Pat. No. 4,948,777, "Infrared absorbing bis(chalcogenopyrylo)polymethine dyes for dye-donor element used in laser-induced thermal dye transfer"; U.S. Pat. No. 4,948,776, "Infrared absorbing chalcogenopyrylo-arylidene dyes for dye-donor element used in laser-induced thermal dye transfer"; U.S. Pat. No. 4,942,141, "Infrared absorbing squarylium dyes for dye-donor element used in laser-induced thermal dye transfer"; U.S. Pat. No. 4,923,638, "Near infrared absorbing composition"; U.S. Pat. No. 4,921,317, "Infrared absorbent comprising a metal complex compound containing two thiolato bidentate ligands"; U.S. Pat. No. 4,913,846, "Infrared absorbing composition"; U.S. Pat. No. 4,912,083, "Infrared absorbing ferrous complexes for dye-donor element used in laser-induced thermal dye transfer"; U.S. Pat. No. 4,892,584, "Water soluble infrared absorbing dyes and ink-jet inks containing them"; U.S. Pat. No. 4,791,023, "Infrared absorbent and optical material using the same"; U.S. Pat. No. 4,788,128, "TRANSFER PRINTING MEDIUM WITH THERMAL TRANSFER DYE AND INFRA-RED RADIATION PHTHALOCYANINE ABSORBER"; U.S. Pat. No. 4,767,571, "Infrared absorbent"; U.S. Pat. No. 4,675,357, "Near infrared absorbing polymerizate"; U.S. Pat. No. 4,508,811, "Recording element having a pyrylium or thiopyrylium-squarylium dye layer and new pyrylium or thiopyrylium-squarylium compounds"; U.S. Pat. No. 4,446,223, "Recording and information record elements comprising oxoindolizine and oxoindolizinium dyes"; U.S. Pat. No. 4,315,983, "2,6-Di-tert-butyl-4-substituted thiopyrylium salt, process for production of same, and a photoconductive composition containing same"; and U.S. Pat. No. 3,495,987, "PHOTOPOLYMERIZABLE PRODUCTS" are also suitable herein when used with an appropriate light source.

A source of suitable infrared-absorbing dyes (including near-, mid-, and far-infrared absorbing dyes) is H. W. Sands Corporation, Jupiter, Fla. Suitable dyes include 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl) ethenyl)-1,1-dimethyl-3-(4-sulfobutyl)-1H-benz[e] indolium, inner salt, free acid having CAS No. [162411-28-1], available from H. W. Sands Corp., Jupiter, Fla. as SDA-4927; 2-[2-[2-(2-pyrimidinothio)-3-[2-(1,3-dihydro-1,1-dimethyl-3-(4-sulfobutyl)-2H-benz[e]indol-2-ylidene)] ethylidene-1-cyclopenten-1-yl]ethenyl]-1,1 dimethyl-3-(4-sulfobutyl)-1H-benz[e]indolium, inner salt, sodium salt, having molecular formula $C41H47N4Na1O6S3$ and molecular weight of about 811 grams per mole, available from H. W. Sands Corp., Jupiter, Fla. as SDA-5802; indocyanine green, having CAS No. [3599-32-4], and molecular weight of about 775 grams per mole, available from H. W. Sands Corp., Jupiter, Fla. as SDA-8662; 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1] and molecular weight of about 619 grams per mole, available from Hampford Research Inc, Strafford, Conn.; or Pisgah Laboratories, Pisgah Forest, N.C. as TIC-5C. Examples of other such dyes may be found in Matsuoka, M., Infrared Absorbing Materials, Plenum Press, New York, 1990, and in Matsuoka, M., Absorption Spectra of Dyes for Diode Lasers, Bunshin Publishing Co., Tokyo, 1990. IR absorbers marketed by American Cyanamid Co., Wayne, N.J.; Cytec Industries, West Paterson, N.J. or by Glendale Protective Technologies, Inc., Lakeland, Fla., under the designation CYASORB IR-99 ([67255-33-8]), IR-126 ([85496-34-0]) and IR-165 (N,N'-2, 5-cyclohexadiene-1,4-diylidenebis[4-(dibutylamino)-N-[4-(dibutylamino)phenyl]benzenaminium bis[(OC-6-11)-hexafluoroantimonate(1-)], [5496-71-9]) may be used.

A specific dye may be chosen based on factors such as solubility in, and compatibility with, a specific binder and/or coating solvent of the LTHC layer, as well as the wavelength ranges of absorption necessary, desired, undesired, and forbidden for the LTHC layer.

Pigmentary materials may also be used in the LTHC layer as light absorbers. Examples of suitable pigments include carbon black and graphite, as well as phthalocyanines, nickel dithiolenes, and other pigments. Additionally, black azo pigments based on copper or chromium complexes of, for example, pyrazolone yellow, dianisidine red, and nickel azo yellow are useful. Inorganic pigments are also valuable. Examples include oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead or tellurium. Metal borides, carbides, nitrides, carbonitrides, bronze-structured oxides, and oxides structurally related to the bronze family are also of utility.

Another suitable LTHC layer includes metal or metal/metal oxide formed as a thin film, for example, black aluminum (i.e., a partially oxidized aluminum having a black visual appearance) or chrome. Metallic and metal compound films may be formed by techniques such as, for example, sputtering and evaporative deposition. Particulate coatings may be formed using a binder and any suitable dry or wet coating techniques.

Materials suitable for the LTHC layer can be inorganic or organic and can inherently absorb the imaging light or serve other purposes such as film formation or adhesion modification.

Examples of components in a suitable light-to-heat conversion layers that are insignificant light-to-heat converters at the wavelengths of interest, but aid in other functions, include typical binders, polymers, and coating aids such as surfactants, and minor light absorbers such as pigments and dyes with insignificant absorbance at the imaging light wavelengths.

In one embodiment, a layer such as the transfer layer, the light-to-heat conversion layer, a layer between the support layer and the transfer layer, or a layer comprising the release-modifier, comprises a binder. In one embodiment the binder is a resin, polymer or copolymer. A suitable binder for use in the present invention may be selected from a variety of materials listed herein, including polyurethanes; polyols (including polyvinylalcohol and ethylene-vinyl alcohol); polyolefins (such as polyethylene, polypropylene and polystyrenes (such as polyalpha-methylstyrene) and polyolefin waxes; polyolefin/bisamide; polyvinylpyrrolidone (PVP); polyvinylpyrrolidone/vinylacetate copolymers (PVPNA); polyacrylic resins; polyalkylmethacrylates (particularly polymethylmethacrylates (PMMA)); acrylic and methacrylic copolymers; sulphonated acrylic and methacrylic copolymers; ethylene/acrylic acid copolymers; acrylic/silica resins (such as Sanmol™); polyesters (including sulphonated polyesters); cellulosic esters and ethers (such as hydroxyethyl and carboxymethyl cellulose); nitrocelluloses; polyimines (such as polyethyleneimine); polyamines (such as polyallylamine); styrene/maleic anhydride copolymers; quaternary ammonium compounds; ammonium lauryl sulphate; Fisher Tropsh nonionic emulsion (available as Michem 64540); polysaccharide resins; halogenated polyolefins including PTFE and polychlorotrifluoroethylene (PCTFE); copolyester resins in alcohol (such as those commercially availableas Vylonal™); sulphonated maleic anhydride; ethylene vinyl acetate; polyoxazoline; high MW polyolefin alcohols (poly ethylene oxide); polyoxymethylene; gelatin; phenolic resins (such as novolak and resole resins); polyvinylbutyral resins; polyvinyl acetates; polyvinyl acetals; polyvinylidene chlorides and fluorides; polyvinyl chlorides and fluorides; polycarbonates; and; and polyalkylenecarbonates. The binder may also comprise the condensation product of an amine such as melamine with an aldehyde such as formaldehyde, optionally alkoxylated (for instance methoxylated or ethoxylated). In addition, the binders recited herein for the transfer layer may also be used in the transfer-assist layer. Preferably, the average particle size of a water-dispersible binder in its aqueous phase is less than 0.1 μm and more preferably less than 0.05 μm, and preferably having a narrow particle size distribution, in order to promote a homogeneous coating layer.

Preferred binders are those which show good compatibility with the radiation absorber, and allow higher loadings of the radiation absorber into the transfer-assist coating layer without significant loss of adhesion of the transfer-assist coating to the substrate layer. Higher loadings of radiation absorber are desirable to increase the amount of radiation absorbed by the transfer-assist coating.

In one embodiment, the binder is selected from the group consisting of acrylic and/or methacrylic resins and optionally sulphonated polyesters, and preferably from polyesters.

Preferred polyester binders are selected from copolyesters comprising functional comonomers which improve hydrophilicity, and which typically introduce pendant ionic groups, preferably an anionic group, into the polyester backbone, for instance pendant sulphonate or carboxylate groups, as is well known in the art.

Suitable hydrophilic polyester binders include partially sulphonated polyesters, including copolyesters having an acid component and a diol component wherein the acid component comprises a dicarboxylic acid and a sulphomonomer containing a sulphonate group attached to the aromatic nucleus of an aromatic dicarboxylic acid. In a preferred embodiment, the sulphomonomer is present in the range of from about 0.1 to about 10 mol %, preferably in the range of from about 1 to about 10 mol %, and more preferably in the range from about 2 to about 6%, based on the weight of the copolyester. In one embodiment, the number average molecular weight of the copolymer is in the range of from about 10,000 to about 15,000. Preferably, the sulphonate group of the sulphomonomer is a sulphonic acid salt, preferably a sulphonic acid salt of a Group I or Group II metal, preferably lithium, sodium or potassium, more preferably sodium. Ammonium salts may also be used. The aromatic dicarboxylic acid of the sulphomonomer may be selected from any suitable aromatic dicarboxylic acid, e.g. terephthalic acid, isophthalic acid, phthalic acid, 2,5-, 2,6- or 2,7-naphthalenedicarboxylic acid. Preferably the aromatic dicarboxylic acid of the sulphomonomer is isophthalic acid. Preferred sulphomonomers are 5-sodium sulpho isophthalic acid and 4-sodium sulpho isophthalic acid. The non-sulphonated acid component is preferably an aromatic dicarboxylic acid, preferably terephthalic acid.

One class of suitable acrylic resin binders comprises at least one monomer derived from an ester of acrylic acid, preferably an alkyl ester wherein the alkyl group is a $C_{1-10}$ alkyl group, such as methyl, ethyl, n-propyl, isopropyl, n-butyl, isobutyl, t-butyl, hexyl, 2-ethylhexyl, heptyl and n-octyl, and more preferably ethyl and butyl. In one embodiment, the resin comprises alkyl acrylate monomer units and further comprises alkyl methacrylate monomer units, particularly wherein the polymer comprises ethyl acrylate and alkyl methacrylate (particularly methyl methacrylate). In a preferred embodiment, the alkyl acrylate monomer units are present in a proportion in the range of from about 30 to about 65 mole % and the alkyl methacrylate monomer units are present in a proportion in the range of from about 20 to about 60 mole %. A further class of acrylic resincomprises at least one monmer derived from an ester of methacrylic acid, preferably an alkyl ester, as described above, and preferably methyl ester. Other monomer units which may be present include acrylonitrile, methacrylonitrile, halo-substituted acrylonitrile, halo-substituted methacrylonitrile, acrylamide, methacrylamide, N-methylol acrylamide, N-ethanol acrylamide, N-propanol acrylamide, N-methacrylamide, N-ethanol methacrylamide, N-methylacrylamide, N-tertiary butyl acrylamide, hydroxyethyl methacrylate, glycidyl acrylate, glycidyl methacrylate, dimethylamino ethyl methacrylate, itaconic acid, itaconic anhydride and half ester of itaconic acid; vinyl esters such as vinyl acetate, vinyl chloracetate and vinyl benzoate, vinyl pyridine, vinyl chloride, vinylidene chloride, maleic acid, maleic anhydride, styrene and derivatives of styrene such as chlorostyrene, hydroxystyrene and alkylated styrenes wherein the alkyl group is a $C_{1-10}$ alkyl group. In one embodiment, the acrylic resin comprises about 35 to 60 mole % ethyl acrylate, about 30 to 55 mole % methyl methacrylate and about 2 to 20 mole % methacrylamide. In a further embodiment, the resin is a polymethylmethacrylate, optionally wherein one or more further comonomer(s) (such as those described above) is/are copolymerized in minor amounts (typically no more than 30%, typically no more than 20%, typically no more than 10% and in one embodiment, no more than 5%). Typically, the molecular weight of the resin is from about 40,000 to about 300,000, and more preferably from about 50,000 to about 200,000.

An acrylic resin suitable for use as the binder component can be in the form of an acrylate hydrosol. Acrylate-based hydrosols have been known for some time (Beardsley and Selby, J. Paint Technology, Vol. 40 521, pp 263-270, 1968), and the production thereof is described in GB-1114133-B and GB-1109656-B. Other acrylate hydrosols are disclosed in U.S. Pat. No. 5,047,454 and U.S. Pat. No. 5,221,584, the disclosures of which are incorporated herein by reference. In one embodiment, an acrylate hydrosol is selected from those disclosed in U.S. Pat. No. 4,623,695 the disclosure of which is incorporated herein by reference. Thus, the acrylic hydrosol may be prepared by the polymerization of:

(a) from about 30 to about 99% by weight of at least one (meth)acrylic acid ester of a $C_{1-8}$ alcohol, (b) from about 0.5 to about 7% by weight of at least one ethylenically unsaturated acid or amide thereof, and (c) from 0 to about 70% by weight of at least one monomer selected from the group consisting of styrene, methyl styrene, acrylonitrile, vinyl acetate, and vinyl chloride, in aqueous emulsion, and particularly wherein the polymerization is carried out in the presence of an emulsifier mixture of (i) at least one alkyl phenol ether sulphate and (ii) at least one of an α-sulphocarboxylic acid, a C1-4 ester thereof, or a salt of either of the foregoing, wherein the carboxylic acid portion thereof contains from 8 to 24 carbon atoms. Typically, the molecular weight of the polymer is in the range of from about 10,000 to about 1,000,000, particularly 40,000 to about 500,000.

In one embodiment, the binder is selected from polytetrafluoroethylene; polyvinyl fluoride (PVF); polyvinylidene fluoride (PVDF); polychlorotrifluoroethylene (PCTFE); polyvinylidene chloride (PVDC); polyvinylchloride (PVC); nitrocelluloses; polymethylmethacrylates; polyalpha-methylstyrene; polyalkylenecarbonates; and polyoxymethylene, and particularly from nitrocelluloses; polymethylmethacrylates; and polyalkylenecarbonates (particularly wherein the alkylene group is C1-C8 alkylene group, particularly a C1-C4 alkylene, and particularly ethylene or polypropylene). In a further embodiment, the binder is selected from nitrocelluloses. In a further embodiment, the binder is selected from polymethylmethacrylates.

In a further embodiment, the binder is selected from styrene-maleic anhydride copolymers.

Suitable binders for use in the LTHC layer include film-forming polymers, such as for example, phenolic resins (i.e., novolak and resole resins), polyvinyl butyral resins, polyvinylacetates, polyvinyl acetals, polyvinylidene chlorides, polyacrylates, cellulosic ethers and esters, nitrocelluloses, polyesters, sulfopolyesters, and polycarbonates. When a binder is present, the light-to-heat converter-to-binder ratio may generally range from about 5:1 to 1:1000 by weight depending on what type of light-to-heat converters and binders are used. Conventional coating aids, such as surfactants and dispersing agents, may be added to facilitate the coating process. The LTHC layer may be coated onto the support layer using a variety of coating methods known in the art. A binder-containing LTHC layer is typically coated to a thickness of 0.001 to 5.0 μm, for example 10 nm, 100 nm, 300 nm, 1 μm, or 5 μm.

Although it is typical to have a single LTHC layer, it is also possible to have more than one LTHC layer, and the different layers can have the same or different compositions, as long as they all function as described herein. The main LTHC layer of importance is that which contributes most significantly to imaging as a result of light-to-heat conversion—typically the layer that achieves the highest temperature during imaging. Other layers may have some slight absorbance of the original imaging beam intensity, but the minor or negligible contribution of the absorbance to the phenomenon of imaging by these layers means they can not be considered a light-to-heat conversion layer.

The transfer layer 130 of FIG. 1 serves to hold transferable material adjacent to a receiver element of an imageable assemblage for image-wise transfer by light. Transfer layers can include any suitable material or materials that are disposed in one or more layers with or without a binder, that can be selectively transferred as a unit or in portions or in part by any suitable transfer mechanism when the donor element is exposed to imaging light that can be absorbed by the light-to-heat conversion layer and converted into heat. In image-wise transfer, the transferred material may but need not be an entire mass of the transfer layer. Components of the transfer layer in a single portion may be selectively transferred to the receiver element while other components are retained with the donor element (e.g. a sublimable dye may transfer while a heat resistant crosslinked polymer matrix holding the dye may remain untransferred).

The transfer layer may be of any thickness which remains functional for transfer to the receiver element and to fulfill the necessary function on the receiver element or the donor element. Typical thickness of a transfer layer may be from 0.1 μm to 20 μm; for example 0.2, 0.5, 0.8, 1, 2, 4, 6, 8, 10, 15, or 20 μm.

The transfer layer may include multiple components including organic, inorganic, organometallic, or polymeric materials. Examples of materials that can selectively patterned from donor elements as transfer layers and/or as materials incorporated in transfer layers include colorants (e.g., pigments and/or dyes dispersed in a binder), polarizers, liquid crystal materials, particles (e.g., spacers for liquid crystal displays, magnetic particles, insulating particles, conductive particles), emissive materials (e.g., phosphors and/or organic electroluminescent materials), non-emissive materials that may be incorporated into an emissive device (for example, an electroluminescent device) hydrophobic materials (e.g., partition banks for ink jet receptors), hydrophilic materials, multilayer stacks (e.g., multilayer device constructions such as organic electroluminescent devices), microstructured or nanostructured layers, etch resist, metals, polymers, adhesives, binders, and bio-materials, and other suitable materials or combination of materials.

The transfer layer can be coated onto light-to-heat conversion layer, or other suitable adjacent donor element layer. The transfer layer or its precursor may be applied by any suitable technique for coating a material such as, for example, bar coating, gravure coating, extrusion coating, vapor deposition, lamination and other such techniques. Prior to, after or simultaneous with coating, a cross-linkable transfer layer material or portions thereof may be crosslinked, for example by heating, exposure to radiation, and/or exposure to a chemical curative, depending upon the material.

In one embodiment, the transfer layer includes material that is useful in display applications. Thermal transfer according to the present invention can be performed to pattern one or more materials on a receiver element with high precision and accuracy using fewer processing steps than for photolithography-based patterning techniques, and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers, phosphor layers, organic electroluminescent devices, organic transistors, and other such elements, devices, or portions thereof that can be useful in displays, alone or in combination with other elements that may or may not be patterned in a like manner.

In particular embodiments, the transfer layer can include a colorant. Pigments or dyes, for example, may be used as colorants. In one embodiment, pigments having good color permanency and transparency such as those disclosed in the NPIRI Raw Materials Data Handbook, Volume 4 (Pigments), are used. Examples of suitable transparent colorants include Ciba-Geigy Cromophtal Red A2B®, Dainich-Seika ECY-204®, Zeneca Monastral Green 6Y-CL®, and BASF Heliogen Blue L6700®. Other suitable transparent colorants include Sun RS Magenta 234-007®, Hoechst GS Yellow GG 11-1200®, Sun GS Cyan 249-0592®, Sun RS Cyan 248-061, Ciba-Geigy BS Magenta RT-333D®, Ciba-Geigy Microlith Yellow 3G-WA®, Ciba-Geigy. Microlith Yellow 2R-WA®, Ciba-Geigy Microlith Blue YG-WA®, Ciba-Geigy Microlith Black C-WA®, Ciba-Geigy Microlith Violet RL-WA®, Ciba-Geigy Microlith Red RBS-WA®, any of the Heucotech Aquis II® series, any of the Heucosperse Aquis III series, and the like. Another class of pigments than can be used for colorants in the present invention are various latent pigments such as those available from Ciba-Geigy. Transfer of colorants by thermal imaging is disclosed in U.S. Pat. Nos. 5,521,035; 5,695,907; and 5,863,860.

In some embodiments, the transfer layer can include one or more materials useful in emissive displays such as organic electroluminescent displays and devices, or phosphor-based displays and devices. For example, the transfer layer can include a crosslinked light emitting polymer or a crosslinked charge transport material, as well as other organic conductive or semiconductive materials, whether crosslinked or not. For organic light emitting diodes (OLEDs) that are polymeric, it may be desirable to crosslink one or more of the organic layers to enhance the stability of the final OLED device. Crosslinking one or more organic layers for an OLED device prior to thermal transfer may also be desired. Crosslinking before transfer can provide more stable donor media, better control over film morphology that might lead to better transfer and/or better performance properties in the OLED device, and/or allow for the construction of unique OLED devices and/or OLED devices that might be more easily prepared when crosslinking in the device layer(s) is performed prior to thermal transfer.

Examples of light emitting polymers include poly(phenylenevinylene)s (PPVs), poly-para-phenylenes (PPPs), and polyfluorenes (PFs). Specific examples of crosslinkable light emitting materials that can be useful in transfer layers of the present invention include the blue light emitting poly(methacrylate) copolymers disclosed in Li et al., Synthetic Metals 84, pp. 437-438 (1997), the crosslinkable triphenylamine derivatives (TPAs) disclosed in Chen et al., Synthetic Metals 107, pp. 203-207 (1999), the crosslinkable oligo- and poly (dialkylfluorene)s disclosed in Klarner et al., Chem. Mat. 11, pp. 1800-1805 (1999), the partially crosslinked poly(N-vinylcarbazole-vinylalcohol) copolymers disclosed in Farah and Pietro, Polymer Bulletin 43, pp. 135-142 (1999), and the oxygen-crosslinked polysilanes disclosed in Hiraoka et al., Polymers for Advanced Technologies 8, pp. 465-470 (1997).

Specific examples of crosslinkable transport layer materials for OLED devices that can be useful in transfer layers of the present invention include the silane functionalized triarylamine, the poly(norbornenes) with pendant triarylamine as disclosed in Bellmann et al., Chem Mater 10, pp. 1668-1678 (1998), bis-functionalized hole transporting triarylamine as disclosed in Bayerl et al., Macromol. Rapid Commun. 20, pp. 224-228 (1999), the various crosslinked conductive polyanilines and other polymers as disclosed in U.S. Pat. No. 6,030,550, the crosslinkable polyarylpolyamines disclosed in International Publication WO 97/33193, and the crosslinkable triphenyl amine-containing polyether ketone as disclosed in Japanese Unexamined Patent Publication Hei 9-255774.

Light emitting, charge transport, or charge injection materials used in transfer layers of the present invention may also have dopants incorporated therein either prior to or after thermal transfer. Dopants may be incorporated in materials for OLEDs to alter or enhance light emission properties, charge transport properties and/or other such properties.

Thermal transfer of materials from donor sheets to receptors for emissive display and device applications is disclosed in U.S. Pat. Nos. 5,998,085 and 6,114,088, and in PCT Publication WO 00/41893.

The transfer layer can optionally include various additives. Suitable additives can include IR absorbers, dispersing agents, surfactants, stabilizers, plasticizers, crosslinking agents and coating aids. The transfer layer may also contain a variety of additives including but not limited to dyes, plasticizers, UV stabilizers, film forming additives, and adhesives.

It is typical for a transfer layer with a binder that the polymer of the binder does not self-oxidize, decompose or degrade at the temperature achieved during the heat exposure so that the exposed areas of the transfer layer, are undamaged. Examples of suitable binders include styrene polymers and copolymers, including copolymers of styrene and (meth)acrylate esters and acids, such as styrene/methylmethacrylate and styrene/methyl-methacrylate/acrylic-acid, copolymers of styrene and olefin monomers, such as styrene/ethylene/butylene, and copolymers of styrene and acrylonitrile; fluoropolymers; polymers and copolymers of (meth)acrylic acid and the corresponding esters, including those with ethylene and carbon monoxide; polycarbonates; polysulfones; polyurethanes; polyethers; and polyesters. The monomers for the above polymers can be substituted or unsubstituted. Mixtures of polymers can also be used. Other suitable binders include vinyl chloride polymers, vinyl acetate polymers, vinyl chloride-vinyl acetate copolymers, vinyl acetate-crotonic acid copolymers, styrene maleic anhydride half ester resins, (meth)acrylate polymers and copolymers, poly(vinyl acetals), poly(vinyl acetals) modified with anhydrides and amines, hydroxy alkyl cellulose resins and styrene acrylic resins.

In the present invention, also disposed between the support layer and the transfer layer there may be a release-modifier, that may be disposed in the support layer or in another layer. One common benefit of the release-modifier in a layer is that a larger portion of transferable material can be transferred from the transfer layer of the donor element to the receiver element during imaging. Another common benefit for colored transferred materials is that better color and luminance of transferred material can be obtained. Another common benefit of the release-modifier is that transfer occurs with less damage or less decomposition of the transferred material. Another common benefit is that the width of features transferred is closer to the desired width as determined by the width illuminated by the light source during the imaging.

Another common benefit is that the change in results due to variation of light energy delivered is smaller than in the absence of a release-modifier. For example, when the wattage delivered to a laser head is varied from 14 to 23 watts, the change in amount of: transferable material transferred from the donor element to the receiver element; the color and luminance of the transferred material; or the width of transferred features, is lower when a release-modifier is used than when no release-modifier is present. Since multiple laser pixels are often used simultaneously for imaging, and the exact energy delivered by each such pixel in a head can be expected to vary, a robust process is enabled by a release-modifier that makes the quality of transfer relatively insensitive to variations in the amount of light delivered to cause the transfer.

Figure 2:
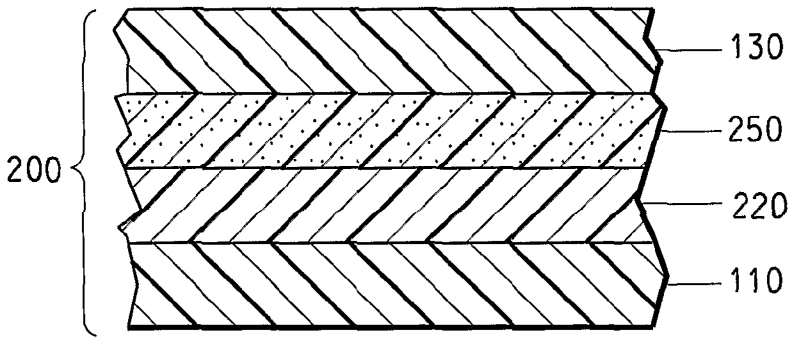
FIG. 2 is a schematic cross-section of a second embodiment of a donor element containing a release-modifier.
Figure 3:
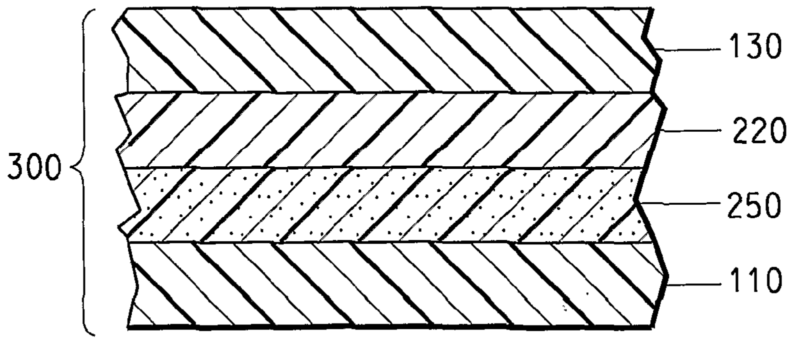
FIG. 3 is a schematic cross-section of another embodiment of a donor element containing a release-modifier.

FIG. 1 illustrates a donor element embodiment having a release-modifier incorporated into the light-to-heat conversion layer 120 that is applied prior to the completion of stretching of the support layer. FIG. 2 illustrates donor element embodiment 200 comprising sequentially a support layer 110, a light-to-heat conversion layer 220 stretched before the introduction of the transfer layer during the completion of the stretching of the support layer, a release-modifier layer 250, and a transfer layer 130. (In each figure, elements repeated from another figure are similarly numbered.) FIG. 3 illustrates donor element embodiment 300 comprising sequentially a support element 110, a release-modifier layer 250, a light-to-heat conversion layer 220 stretched before the introduction of the transfer layer, and a transfer layer 130. FIGS. 2 and 3 illustrate embodiments of the present invention with layers comprising the release-modifier being separate from the light-to-heat conversion layer. As noted, other layers can also be disposed in the donor element as known in the art.

The fundamental mechanism of the improved utility of using a stretched light-to-heat conversion layer is not conclusively determined, but one may speculate without limiting or restricting the invention that stretching of the light-to-heat layer and the support layer and at least all intervening layers serves to improve interlayer adhesion, as well as serving to thin the layers while maintaining the homogeneity of the layers. This improvement in interlayer adhesion can produce a cleaner separation of the transferred material from untransferred components of the donor element. A thinning of the layers can change the temperature distribution encountered during imaging due to light-to-heat conversion. There may also be a change in the chemical nature of the surface of the donor element that is subsequently coated by the transfer layer or other layers that are not stretched.

The fundamental mechanism of the improved utility of the inclusion of a release-modifier is not conclusively determined, but one may speculate without limiting or restricting the invention that a release-modifier maintains the water content of a layer of the donor element within certain appropriate levels over a relatively wide range of ambient humidity in the processing environment. The appropriate levels of internal water content can be speculated to favorably affect some property such as interlayer adhesion or thermal conductivity during the imaging process.

Another speculated mechanism of the improved utility of using a release-modifier, that is advanced without the intention of limiting or restricting the invention, is that the release-modifier acts to lower one of cohesive energy or adhesive energy or heat flow within or between layers, so that transfer of materials happens at lower amounts of light absorbance or similarly over a wider range of light absorbance or at a different location than in the absence of the release-modifier.

A compound can be recognized as a possible release-modifier by observations that can include but are not limited to: humectant properties; antistatic properties; and surface active properties. The presense of an organic cation, particularly a cation of nitrogen, boron, sulphur, or phosphorous; or the presense of an ammonium cation having three or four carbon substituents and one or zero proton on nitrogen, (e.g. the quaternary ammonium cation stearamidopropyldimethyl-β-hydroxyethylammonium cation, C17H35C(═O)NHC3H6N(CH3)2(C3H6OH) having 26 carbons in four substituents to nitrogen, or protonated tertiary ammonium cation from dimethylaminoethanol having one proton bonded directly to nitrogen); the presense of an organic anion, particularly an anion containing at least one of oxygen, phosphorous, nitrogen or sulfur; for example oxygen containing ammonium dodecanoate, or sulfur-containing dodecyl sulfate (e.g. ionized long chain organic carboxylates, organic sulphonates, and organic sulphates, having from 8 to 40 carbon atoms in the organic group), or phosphorous containing phenylphosphonate, long chain diesters of the sulfosuccinate group, having 6 to 40 carbons in at least one ester group, (e.g. 2-ethylhexyl sulfosuccinate anion), perfluorinated and partially fluorinated organic anion groups having 1 to 40 carbon atoms and 1 to 81 fluorines, (e.g. trifluoromethanesulphonate and perfluoro-octanoate); the presense of a phosphorous-containing anion including organophosphate and inorganic phosphate anions (e.g. dihydrogen phosphate monoanion, monohydrogen phosphate dianion, ethyl hydrogen phosphate monoanion) and phosphonate anions (e.g. phenyl phosphonate dianion as in phenylphosphonic acid disodium salt CAS [25148-85-0]); the presense of fluorinated organic anions (e.g. trifluoromethanesulfonate); and the presense of a polyglycolether derivative (e.g. nonionic such as alkylphenol polyethoxylates having from 8 to 100 carbon atoms (e.g. surfactants) including polyethoxylated nonylphenol, and amine-containing ethoxylates, including materials such as Elfugin PF having between 4 and 100 ethoxylate groups), and including each compound having a total of at least 1, 2, 3, 4, 8, 10, 16, 20, 24, 32, 40, or 80 carbon and less than or equal to 4, 8, 10, 16, 20, 24, 32, 40, 80, or 150 carbon atoms.

Quaternary ammonium cations are those positively charged structures where a conventional structure drawing shows eight electrons around nitrogen, with no lone pair of electrons on nitrogen, but rather four single bonds to four distinct carbon atoms; or two single bonds to two distinct carbon atoms and a double bond to a third distinct carbon atom.

Further possible release-modifier classes are recognized among organic and organometallic compounds having one or more polyoxyethylene and/or polyoxypropylene chains, also termed (ethylene-, propylene-) alkoxylated compounds, having at least one of (R1)—(CH2—CH2-O)n—(R2) or (R1)—(CH2—CH(CH3)—O)n—(R2) or random or block copolymer segments of —CH2—CH2—O— or —CH2—CH(CH3)—O— or —CH(CH3)—CH2—O—, when R1 and R2 do not continue the attached polyoxyethylene and/or polyoxypropylene chain, and one but not both of R1 and R2 may be H (hydrogen), and n is equal to or greater than 1. In one embodiment, n can be greater than a selection from 1, 2, 3, 4, 10, 20, and 100, and n can be less than a selection from 100, 25, 15, and 5. In one embodiment, exactly one of R1 and R2 is H. In one embodiment, neither R1 nor R2 is H. In one embodiment, R2 is H. In one embodiment, the number of separate polyoxyethylene and/or polyoxypropylene chains in a single compound (wherein each n is selected to be as large as possible) is a selection from 1, 2, 3, 4, and more than 4 separate chains. In one embodiment, the number of separate polyoxyethylene and/or polyoxypropylene chains in a single compound (wherein each n is selected to be as large as possible) is a selection from less than 3, 4, 5, 10, 20, 50, and 100 separate chains.

In one embodiment of release-modifiers that are (ethylene-, propylene-) alkoxylated, the release-modifier comprises one or more of an amine group or a nitrogen atom.

In one embodiment, the counter anion for the cation include is chosen from chloride, bromide, iodide, phosphate, hydroxide, nitrate, benzoate and substituted benzoate, and acetate and substituted acetate. In one embodiment, the counter cation for the anion is choosen from ammonium, lithium, sodium, potassium, calcium, zinc, and magnesium.

Ethoxylated materials are those that are formally derived by addition of one or more of the molecules of ethylene oxide or propylene oxide in a ring opening mode to a hydroxylic oxygen, thiolic sulphur, or amino nitrogen group of a parent compound, thereby having at least one OH terminus, the parent compound containing at least one carbon not a part of a CH2CH2O, OCH(CH3)CH2 or CH(CH3)CH2O group. An (ethylene-, propylene-) alkoxylated substituted alcoholic compound comprising an amino nitrogen is termed an (ethylene-, propylene-) alkoxylated amine compound. Such a compound comprises at least one of CH2CH2O, OCH(CH3)CH2 or CH(CH3)CH2O segments. A parent compound can contain CH2CH2O, OCH(CH3)CH2 or CH(CH3)CH2O groups, so long as an OH group does not terminate the group or string of groups.

In one embodiment, a monosubstituted poly([ethylene-propylene]oxide) alcoholic compound is used (substituted at only one hydroxylic oxygen, thiolic sulphur, or amino nitrogen group) of a parent compound free of CH2CH2O, OCH(CH3)CH2 or CH(CH3)CH2O groups. An example is polyethylene glycol nonyl phenyl ether, CAS Number 901645-9, whose parent compound in nonyl phenol. In one embodiment, a disubstituted poly([ethylene-propylene]oxide) alcoholic compound is used (substituted at a total of two hydroxylic oxygen, thiolic sulphur, or amino nitrogen groups) of parent compound free of CH2CH2O, OCH(CH3)CH2 or CH(CH3)CH2O groups. An example is 2,4,7,9-tetramethyl-5-decyne-4,7-diol ethoxylate of average relative molar mass of 1,200, CAS Number 9014-85-1. In one embodiment, a trisubstituted poly([ethylene-propylene]oxide) alcoholic compound is used (substituted at a total of three hydroxylic oxygen, thiolic sulphur, or amino nitrogen groups). An example is polyoxyethylenesorbitan monostearate of average relative molar mass of 1,312, CAS Number 9005-67-8. In one embodiment, a tetrasubstituted poly([ethylene-propylene]oxide) alcoholic compound is used (substituted at a total of four hydroxylic oxygen, thiolic sulphur, or amino nitrogen groups) of parent compound free of —CH2CH2O—, —OCH(CH3)CH2— or —CH(CH3)CH2O— groups. Two examples are ethylenediamine tetrakis(ethoxylate-block-propoxylate)tetrol of average relative molar mass of 7000, CAS Number 26316-40-5, and tetrakis(propoxylate-block-ethoxylate)tetrol of average relative molar mass of 3600, CAS Number 11111-34-5. Higher extents of substitution (5, 6, 7, and higher) than 1, 2, 3, and 4 fold substitution herein illustrated are also contemplated as a part of a useful embodiment.

In one embodiment, the mass fraction percentage of —CH2CH2O— or —CH(CH3)CH2O— groups of relative molecular mass of 44 or 58 respectively in the Poly([ethylene-propylene]oxide) substituted alcoholic compound of the release-modifier layer is between two selections of 5, 10, 15, 20, 25, 30, 35, 40, 45, 55, 65, 75, 80, 85, 90, 95, 98, 99, and 99.9%.

Examples of suitable release-modifiers include humectants, antistats, emulsifiers, and surfactants. Specific examples include stearamidopropyldimethyl-β-hydroxyethylammonium dihydrogen phosphate (CAS [3758-54-1]) stearamidopropyldimethyl-β-hydroxyethylammonium dihydrogen phosphate (available in Cyastat SP, Cytec Industries, West Paterson, N.J. as a 35% solution), potassium (dimethylaminoethanol) ethyl phosphate produced by neutralizing ethyl acid phosphate with potassium hydroxide and subsequently dimethylaminoethanol, Elfugin PF, Elfugin AKT, lithium trifluoromethanesulfonate, N,N,N'-tris(2-hydroxyethyl)-N,N'-dimethyl-N'-octadecyl-1,3-propanediaminium bis(methyl sulfate) salt, ammonium dodecyl sulphate, sodium 2-ethylhexyl sulfosuccinate (as in Aerosol OT-75), organic amines and amides, esters of fatty acids, organic acids, polyoxyethylene derivatives, semiconductors, and various organic and inorganic salts.

Other chemical functional groups that can confer the property of release-modification for a release-modifier include the alkanolamide group, alkylarylsulfonate group, amine oxide group, sulfonated amines and amide group, betaine group, carboxylated alcohol ethoxylate group, diphenyl sulfonate group, ethoxylated alcohol group, ethoxylated alkyl phenol group, ethoxylated amines and amide group, ethoxylated fatty acid group, fluorocarbon-based surfactant group, glycerol ester group, imidazolines group, imidazoline group, isethionate group, lanolin-based group, lecithin group, lecithin group, lignin group, monoglyceride group, olefin sulfonate group, phosphate group, phosphate ester group, polyamino carboxylic acid group, quarternary surfactant group, sarcosine group, silicone-based surfactant group, sorbitan group, sucrose or glucose ester group, sulfonate group, sulfosuccinamate group, and the taurate group.

The suitable amount of release-modifier in a layer can be varied over a large range, and is typically lower in amount when the release-modifier attracts a large amount of water and higher when the release-modifier attracts a small amount of water. Typically the highest fraction of release-modifier in a layer is greater than 0.01, 0.05, 0.1, 0.2, 0.5, 1, 2, 3, 4, 5, 6, 8, 10, 12, 16, 20, 30, 50, or 80%, and equal to or less than 100, 90, 70, 40, 25, 15, 10, 5, 1, or 0.25% by percentage mass ratio of the layer. One or more release-modifiers can be used in one or more layers between the support layer and the transfer layer.

In one embodiment, the thickness of a release-modifier layer comprising the release-modifier is equal to or less than 5 μm in thickness. Other useful thicknesses include less than or equal to 3 μm, 2 μm, 1 μm, 400 nm, 300 nm, 200 nm, 150 nm, 100 nm, 75 nm, 50 nm, and 30 nm.

The release-modifier layer and the LTHC layer can overlap or coexist. More than one release-modifier layer can be used, having the same or different release-modifiers. One or more than one release-modifier can be used in each release-modifier layer.

Characteristics and methods applicable to one of the release-modifier and LTHC layers are typically applicable to the other. For example, the methods of application, the suitable binders and other ingredients, and the preferred thickness of one layer are typically allowed for an embodiment of the other. This is most obvious when a single layer provides both the release-modifier and light-to-heat conversion function.

Either or both of the LTHC and release-modifier layer can be applied by previously known methods such as gravure roll coating, reverse roll coating, dip coating, bead coating, slot coating, lamination, extrusion, or electrostatic spray coating.

In one embodiment, a light-to-heat conversion layer or its precursor coating composition can be applied to a support layer during the processing of the support layer carried out to obtain the final thickness of the support layer, for example between two stages (longitudinal and transverse) of a biaxial stretching operation or any time prior to the completion of the last stretching operation. Such a sequence of release-modifier layer coating and stretching is especially useful for the production of a coated linear polyester film support layer that in one embodiment is firstly stretched in the longitudinal direction over a series of rotating rollers, coated with the coating composition, and then stretched transversely in a stenter oven, and optionally followed by heat setting. The coating composition may be applied to the support layer by any suitable conventional coating technique such as gravure roll coating, reverse roll coating, dip coating, bead coating, slot coating or electrostatic spray coating.

Prior to deposition of the coating composition onto the polymeric support layer, the exposed surface thereof may, if desired, be subjected to a chemical or physical surface-modifying treatment to improve the bond between that surface and the subsequently applied coating composition. One embodiment is to subject the exposed surface of the support layer to a high voltage electrical stress accompanied by corona discharge. Alternatively, the support layer may be pretreated with an agent known in the art to have a solvent or swelling action on the support layer polymer. Examples of such agents, which are particularly suitable for the treatment of a polyester support layer, include a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol. A treatment by corona discharge may be effected in air at atmospheric pressure with conventional equipment using a high frequency, high voltage generator, preferably having a power output of from 1 to 20 kw at a potential of 1 to 100 kV. Discharge is conventionally accomplished by passing the film over a dielectric support roller at the discharge station at a linear speed preferably of 0.01 to 10 m/s. The discharge electrodes may be positioned 0.1 to 10.0 mm from the moving film surface.

One or more other conventional thermal transfer donor element layers can be included in the donor element of the instant invention, including but not limited to an interlayer, release layer, ejection layer, and thermal insulating layer.

In one embodiment, the donor element including a layer having at least one release-modifier has a light-to-heat conversion layer having at least one particulate light absorber such as carbon black. The release-modifier-containing and light-to-heat conversion layers can be separate or one and the same.

In one embodiment, the donor element includes a layer having at least one release-modifier, and a light-to-heat conversion layer having at least one non-particulate light absorber such as a dye. A benefit of a dissolved light absorber is that homogeneous layers without particle agglomeration can be formed, so that very thin layers absorb light homogeneously. Another benefit of a dissolved light absorber is that light scattering is reduced. It is possible for a dissolved light absorber to be accompanied by an undissolved form of the same light absorber. In one embodiment, the dissolved (non-particulate) form of a light absorber constitutes the majority by mass of that absorber.

The release-modifier-containing and light-to-heat conversion layers can be separate or one and the same.

In one embodiment, the donor element includes a layer having at least one release-modifier, and a light-to-heat conversion layer having at least one spectrum-selective non-particulate light absorber such as an infrared dye. A benefit of a spectrum-selective light absorber is that the absorbance spectrum can be selected for utility with the imaging light source, and the transmission spectrum can be selected for utility with a focussing laser or with inspection procedures by human or machine.

A donor element of the present invention can be utilized for thermal transfer imaging onto a receiver element in a imageable assemblage. After transfer, either or both of the spent donor element (a negative of the image) and the imaged receiver element (a positive of the image) may be useful as a functional object.

Figure 4A:
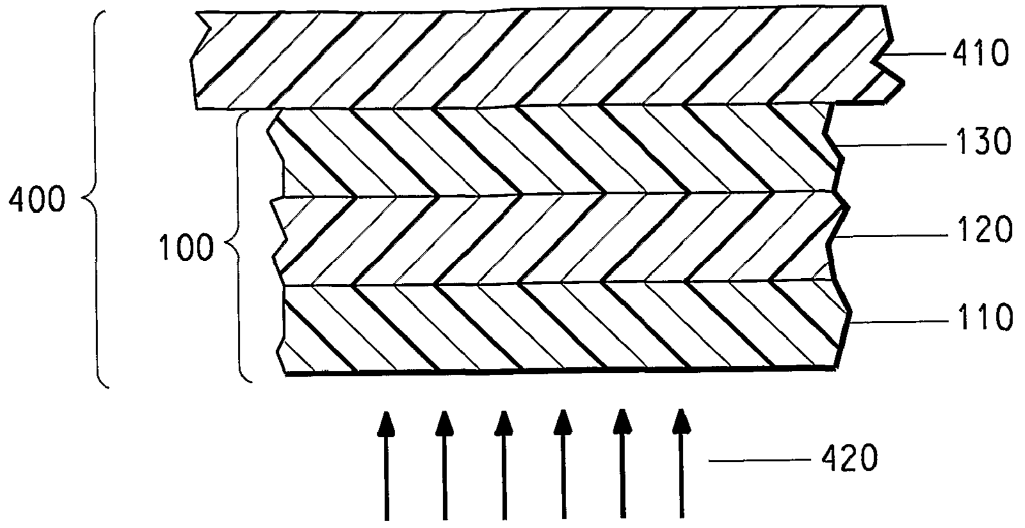
FIGS. 4A and 4B are schematic cross-sections of different embodiments of an imageable assemblage of a donor element adjacent a receiver element, where

FIG. 4A shows an embodiment of an imageable assemblage 400 with the transfer layer 130 of the donor element 100 in contact with a receiver element 410. Light 420 can impinge on the support layer 110 and subsequently the light-to-heat conversion and release-modifier layer 120 and can be absorbed by the light-to-heat conversion and release-modifier layer 120. When sufficient light is absorbed and produces the appropriate heating, the selected portion of the transfer layer 130 adjacent the appropriately heated LTHC layer will transfer to the receiver element.

Figure 4B:
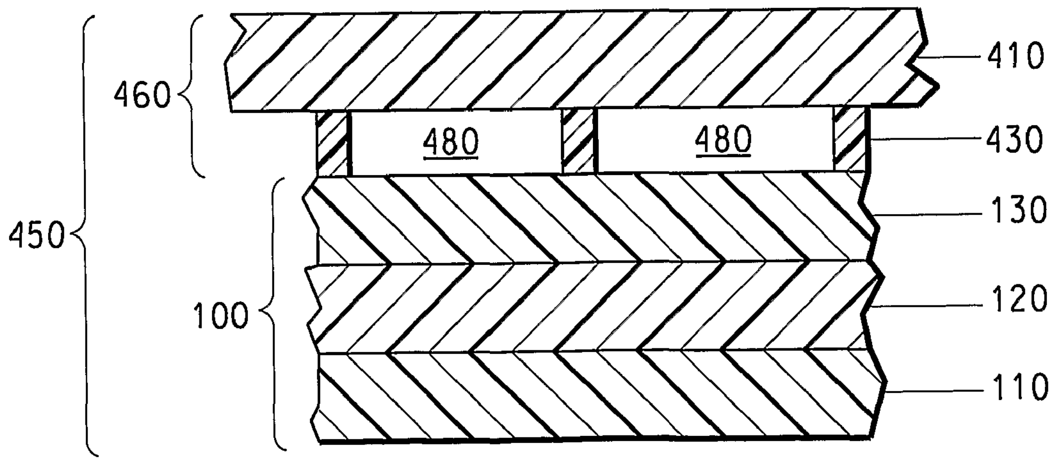
Figure 5:
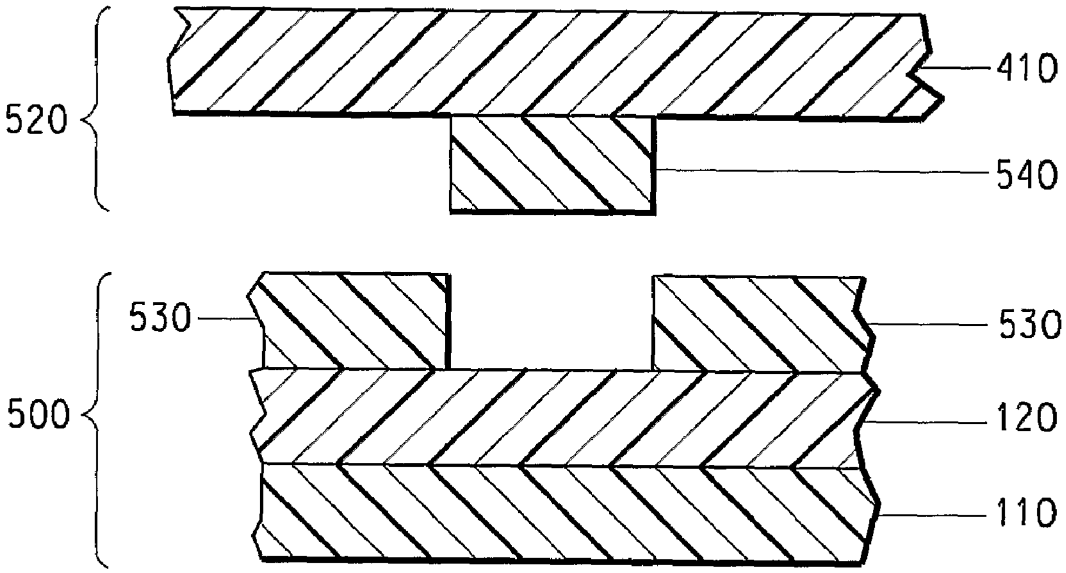
FIG. 5 is a schematic cross-section of an imaged donor element and an imaged receiver element of an imaged and separated imageable assemblage.

FIG. 4B shows an embodiment of an imageable assemblage 450 with the transfer layer 130 of the donor element 100 in intermittent contact with the receiver element 460 along the surface of previously transferred material 430 placed upon receiver base layer 410. The receiver layer 410, can be separated by a short distance from the transfer layer 130, for example by air 480. Light can impinge on the support layer 110 and the light-to-heat conversion and release-modifier layer 120 and can be absorbed by the light-to-heat conversion and release-modifier layer 120. When sufficient light is absorbed and produces the appropriate heating, the selected portion of the transfer layer 130 adjacent the appropriately heated LTHC layer will transfer to the receiver element 460. A textured receiver such as 460 can be obtained by a prior thermal transfer and separation step as shown in FIG. 5. In imageable assemblage 450, the donor element is in contact with the receiver element 460. The contact is intermittent rather than continuous. The layers of the donor element are adjacent the layer 410, though not necessarily in contact with the layer 410—the term adjacent not requiring contact.

FIG. 5 shows for one embodiment the products of separation of the assemblage 400 after image-wise exposure to sufficient light, for the case where the entire volume of the transfer layer is transferred (mass transfer) in sufficiently illuminated areas. After separation, the spent donor element 500 has the support layer 110 below the LTHC layer 120, and retained portions 530 of the transfer layer. The imaged receiver element 520 has new transferred material 540 from the transfer layer in the areas corresponding to the illumination, upon the original receiver 410.

The receiver element may be any item suitable for a particular application including, but not limited to, glass, transparent films, reflective films, metals, semiconductors, various papers, and plastics. For example, receiver elements may be any type of substrate or display element suitable for display applications. Receiver elements suitable for use in displays such as liquid crystal displays or emissive displays include rigid or flexible substrates that are substantially transmissive to visible light. Examples of rigid receiver elements include glass, indium tin oxide coated glass, low temperature polysilicon (LTPS), and rigid plastic. Suitable flexible substrates include substantially clear and transmissive polymer films, reflective films, non-birefringent films, transflective films, polarizing films, multilayer optical films, and the like. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 to 200 mils (i.e., 0.05 to 5 mm) is preferred.

For glass receiver elements, a typical thickness is 0.2 to 2.0 mm. It is often desirable to use glass substrates that are 1.0 mm thick or less, or even 0.7 mm thick or less. Thinner substrates result in thinner and lighter weight displays. Certain processing, handling, and assembling conditions, however, may suggest that thicker substrates be used. For example, some assembly conditions may require compression of the display assembly to fix the positions of spacers disposed between the substrates. The competing concerns of thin substrates for lighter displays and thick substrates for reliable handling and processing can be balanced to achieve a preferred construction for particular display dimensions.

If the receiver element is a polymeric film, it may be preferred that the film be non-birefringent to substantially prevent interference with the operation of the display in which it is to be integrated, or it may be preferred that the film be birefringent to achieve desired optical effects. Exemplary non-birefringent receiver elements are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., those sold under the trade designation Zeonex.™. from Nippon Zeon Co., Ltd.). Exemplary birefringent polymeric receiver elements include multilayer polarizers or mirrors such as those disclosed in U.S. Pat. Nos. 5,882,774 and 5,828,488, and in International Publication No. WO 95/17303.

The donor element is placed adjacent a receiver element in a fixed spatial relationship, comprising in order the support layer, the transfer layer, and the receiver element. The combination of the donor element and the receiver element is termed an imageable assemblage. The imageable assemblage is image-wise exposed to imaging light, causing local movement of material from the transfer layer of the donor element towards the receiver element. After imaging, the assemblage is termed an imaged assemblage. The imaged donor element (also called the spent donor element) and the imaged receiver element of the imaged assemblage are then separated.

In some instances, it may be necessary, desirable, and/or convenient to sequentially use two or more different donor elements to form a device, such as an optical display. For example, a black matrix may be formed on a glass panel to provide a receiver element, followed by the thermal transfer of color filter elements in the windows of the black matrix by sequential use of colored donor elements. As another example, a black matrix may be formed, followed by the thermal transfer of one or more layers of a thin film transistor. As another example, multiple layer devices can be formed by transferring separate layers or separate stacks of layers from different donor elements. Multilayer stacks can also be transferred as a single transfer unit from a single donor element. Examples of multilayer devices include transistors such as organic field effect transistors (OFETs), organic electroluminescent pixels and/or devices, including organic light emitting diodes (OLEDs). Multiple donor sheets can also be used to form separate components in the same layer on the receptor. For example, three different color donors can be used to form color filters for a color electronic display. Also, separate donor sheets, each having multiple layer transfer layers, can be used to pattern different multilayer devices (e.g., organic light emitting diodes (OLEDs) that emit different colors, OLEDs and organic field effect transistors (OFETs) that connect to form addressable pixels, etc.). A variety of other combinations of two or more donor elements can be used to form a device, each thermal transfer element forming one or more portions of the device. It will be understood other portions of these devices, or other devices on the receptor, may be formed in whole or in part by any suitable process including photolithographic processes, ink jet processes, and various other printing or mask-based processes.

The donor element of the present invention can be made by a variety of methods. In one embodiment, a light-to-heat conversion layer coating composition or its precursor diluted coating composition can be coated on to a support layer and optionally concentrated. The coating composition may be applied to the support layer by any suitable conventional coating technique such as gravure roll coating, reverse roll coating, dip coating, bead coating, slot coating or electrostatic spray coating.

Prior to deposition of the coating composition onto the support layer, the exposed surface thereof may, if desired, be subjected to a chemical or physical surface-modifying treatment to improve the bond between that surface and the subsequently applied coating composition. One embodiment is to subject the exposed surface of the support layer to a high voltage electrical stress accompanied by corona discharge. Alternatively, the support layer may be pretreated with an agent known in the art to have a solvent or swelling action on the support layer polymer. Examples of such agents, which are particularly suitable for the treatment of a polyester support layer, include a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol. A treatment by corona discharge may be effected in air at atmospheric pressure with conventional equipment using a high frequency, high voltage generator, preferably having a power output of from 1 to 20 kw at a potential of 1 to 100 kV. Discharge is conventionally accomplished by passing the film over a dielectric support roller at the discharge station at a linear speed preferably of 0.01 to 10 m/s. The discharge electrodes may be positioned 0.1 to 10.0 mm from the moving film surface.

Vacuum and/or pressure can be used to hold the donor and receiver elements together in the imageable assemblage. As one alternative, the thermally imageable donor and receiver elements can be held together by fusion of layers at the periphery. As another alternative, the thermally imageable donor and receiver elements can be taped together and taped to the imaging apparatus, or a pin/clamping system can be used. As yet another alternative, the thermally imageable donor element can be laminated to the receiver element to afford a laserable assemblage. A laserable assemblage can be conveniently mounted on a drum to facilitate laser imaging, or on a flat, moveable stage. Those skilled in the art will recognize that other engine architectures such as flatbed, internal drum, capstan drive, etc. can also be used with this invention.

The LTHC layer 120 of FIG. 4 acts during imaging to localize a substantial proportion of heat generation into an appropriate region of the donor element, by absorbing the impinging light, so as to cause the transfer of at least some component of the transfer layer to a receiver element. Various mechanisms of transfer can occur, such as but not limited to sublimation transfer, diffusion transfer, mass transfer, ablative mass transfer, melt transfer, etc. In thermal mass transfer, transfer of a full, or partial, intact volume (a mass) of the transfer layer occurs at an area where light impinges, without substantial segregation of the components of the volume. Transfer of at least one component of a volume of a mixture, but not an intact volume including substantially all components, can occur in other cases such as sublimation transfer and diffusion transfer, where a matrix material holding the transferrable material is substantially untransferred.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful.

As used herein, the term "light" is intended to cover radiation having a wavelength from about 200 nm to about 300 μm. This light spectrum can be divided into a ultraviolet (UV) range of about 200 nm to about 400 nm, the visible range of about 400 to about 750 nm, and the infrared (IR) range of about 750 nm to about 300 μm. The near infrared spectrum includes from about 750 to about 2500 nm, the mid infrared spectrum from about 2500 to about 12500 nm, and the far infrared spectrum from about 12500 nm to about 300 μm. The short wavelength near infrared spectrum includes the wavelengths from about 750 nm to about 1200 nm, the long wavelength near infrared spectrum includes the wavelengths from about 1200 nm to about 2500 nm.

In one embodiment, the exposure step is accomplished with an imaging laser at a laser fluence of about 600 $mJ/cm^2$ or less, most typically about 250 to about 440 $mJ/cm^2$. Other light sources and irradiation conditions can be suitable based on, among other things, the donor element construction, the transfer layer material, the mode of thermal transfer, and other such factors.

When high spot placement accuracy is required (e.g., for high information full color display applications) over large substrate areas, a laser is particularly useful as the light source. Laser sources are also compatible with both large rigid substrates (e.g., 1 meter by 1 meter by 1.1 mm and larger substrates such as color filter glass) and continuous or sheeted film substrates (e.g., 100 μm thickness polyimide sheets).

Particularly advantageous are diode lasers, for example those emitting in the region of about 750 to about 870 nm and up to 1200 nm which offer a substantial advantage in terms of their small size, low cost, stability, reliability, ruggedness and ease of modulation. Such lasers are available from, for example, Spectra Diode Laboratories (San Jose, Calif.). One device used for applying an image to the image receiving layer is the Creo Spectrum Trendsetter 3244F, which utilizes lasers emitting near 830 nm. This device utilizes a Spatial Light Modulator to split and modulate the 5-50 Watt output from the ~830 nm laser diode array. Associated optics focus this light onto the imageable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fibre coupled lasers emitting 500-3000 mW and each individually modulated and focused on the media. Such a laser can be obtained from Opto Power in Tucson, Ariz.

Suitable lasers for thermal imaging include, for example, high power (>90 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more.

In one embodiment the imaging light is provided by one or more lasers emitting intensely at a wavelength between 650 and 1300 nm, for example a selection of the ranges of 660 to 900 nm, and 950 to 1200 nm.

In one embodiment, during the imaging the entire transfer layer of the donor element in the selectively illuminated regions is transferred to the receiver element without transferring significant portions or components of the other layers of the thermal mass transfer element, such as an optional interlayer or a light-to-heat conversion layer. This is desirable, especially when the LTHC layer has different properties than the transferred material and can interfere with the functionality obtained by the transfer. For example, a yellow colored or black LTHC layer transferring with a transparent blue transfer layer for a blue color filter window, or an electrically insulating LTHC layer transferring onto a conducting pad with a conductive transfer layer, can be unacceptable.

In another embodiment, the transfer layer is a mixture of components, and transfer by illumination of the donor element only occurs for selected components such as sublimable dyes, or melted components.

The mode of thermal transfer can vary depending on the type of irradiation, the type of materials in the transfer layer, etc., and generally occurs via one or more mechanisms, one or more of which may be emphasized or de-emphasized during transfer depending on imaging conditions, donor constructions, and so forth. The following modes of thermal transfer are not limiting to the invention, and are given for illustrative purposes only.

One speculated mechanism of thermal transfer includes thermal melt-stick transfer whereby localized heating at the interface between the transfer layer and the rest of the donor element can lower the adhesion of the thermal transfer layer to the donor in selected locations. Selected portions of the thermal transfer layer can adhere to the receiver element more strongly than to the donor so that when the donor element is removed, the selected portions of the transfer layer remain on the receptor. Another speculated mechanism of thermal transfer includes ablative transfer whereby localized heating can be used to ablate portions of the transfer layer off of the donor element, thereby directing ablated material toward the receptor. Yet another speculated mechanism of thermal transfer includes sublimation whereby material dispersed in the transfer layer can be sublimated by heat generated in the donor element. A portion of the sublimated material can condense on the receptor.

During imaging, the thermal transfer element can be brought into intimate contact with a receiver element (as might typically be the case for thermal melt-stick transfer mechanisms) or the thermal transfer element can be spaced some distance from the receiver element (as can be the case for ablative transfer mechanisms or transfer material sublimation mechanisms). In at least some instances, pressure or vacuum can be used to hold the thermal transfer element in intimate contact with the receptor. In some instances, a mask can be placed between the thermal transfer element and the receiver element. Such a mask can be removable or can remain on the receiver element after transfer. A light source can then be used to heat the LTHC layer (and optionally other layer(s) containing any light absorber) in an image-wise fashion (e.g., digitally or by analog exposure through a mask) to perform image-wise transfer and/or patterning of the transfer layer from the thermal transfer donor element to the receiver element.

A later step for the assemblage after imaging by image-wise light exposure is separating the imaged donor element from the imaged receiver element (FIG. 5). Usually this is done by simply peeling the two elements apart. This generally requires very little peel force, and is accomplished by simply separating the donor support from the receiver element. This can be done using any conventional separation technique and can be manual or automatic.

Typically the intended product is the receiver element, after light exposure and separation, onto which the transferred material has been transferred in a pattern. However, it is also possible for the intended product to be the donor element after light exposure and separation. In one embodiment where the donor support layer and the LTHC layer are transparent and the transfer layer is opaque, the imaged donor element can be used as a phototool for conventional analog exposure of photosensitive materials, e.g., photoresists, photopolymer printing plates, photosensitive proofing materials, medical hard copies, and the like. For phototool applications, it is important to maximize the density difference between "clear", i.e., laser exposed and "opaque", i.e., unexposed areas of the donor element. Thus the materials used in the donor element must be tailored to fit this application.

In one embodiment, the imaged receiver element can be used as a receiver element of a subsequent imageable assemblage with a donor element.

In one embodiment, using a donor element having layers of varying composition is useful in combination with a receiver element in an imageable assemblage for image-wise transfer of material from the donor element to the receiver element by the result of heat generated by a rapidly scanned, blinking laser beam shining an intense laser beam on areas intended for material transfer. Separation of spent donor element from imaged receiver element provides articles useful for color filters, visual displays, color image reproduction, circuitry, etc.

In one embodiment, a donor element construction of at least three layers comprising a support layer, a layer useful for light-to-heat conversion (LTHC layer) such as a metallic, pigmented, or dye-containing layer, and a transfer layer is supplemented by additional layers in the construction that can be placed between or outside the three layers to modify properties such as interlayer adhesion, light absorption, heat transfer, handling, etc.

Typically, selected portions of the transfer layer are transferred to the receiver element without transferring significant portions of the other layers of the thermal transfer element, such as an optional interlayer or the LTHC layer. The presence of the optional interlayer may eliminate or reduce the transfer of material from the LTHC layer to the receiver element and/or reduce distortion in the transferred portion of the transfer layer. Preferably, under imaging conditions, the adhesion of the optional interlayer to the LTHC layer is greater than the adhesion of the interlayer to the transfer layer. In some instances, a reflective interlayer can be used to attenuate the level of imaging light transmitted through the interlayer and reduce any damage to the transferred portion of the transfer layer that may result from interaction of the transmitted light with the transfer layer and/or the receptor. This is particularly beneficial in reducing thermal damage which may occur when the receiver element is highly absorptive of the imaging light.

During laser exposure, it may be desirable to minimize formation of interference patterns due to multiple reflections from the imaged material. This can be accomplished by various methods. The most common method is to effectively roughen the surface of the thermal transfer element on the scale of the incident light as described in U.S. Pat. No. 5,089,372. This has the effect of disrupting the spatial coherence of the incident light, thus minimizing self interference. An alternate method is to employ an antireflection coating within the thermal transfer element. The use of anti-reflection coatings is known, and may consist of quarter-wave thicknesses of a coating such as magnesium fluoride, as described in U.S. Pat. No. 5,171,650.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receiver element substrate moved beneath the laser.

In some instances, it may be necessary, desirable, and/or convenient to sequentially use two or more different thermal transfer elements to form a device, such as an optical display.

For example, a black matrix defining pixel windows may be formed on a glass plate by thermal transfer imaging, followed by the sequential thermal transfer of multiple colors into separate windows, forming color filter elements in the windows of the black matrix. As another example, a black matrix may be formed, followed by the thermal transfer of one or more layers of a thin film transistor using for switching transparency in a liquid crystal display. As another example, multiple layer devices can be formed by transferring separate layers or separate stacks of layers from different thermal transfer elements. Multilayer stacks can also be transferred as a single transfer unit from a single donor element. Examples of multilayer devices include transistors such as organic field effect transistors (OFETs), organic electroluminescent pixels and/or devices, including organic light emitting diodes (OLEDs). Multiple donor sheets can also be used to form separate components in the same layer on the receptor. For example, three different color donors can be used to form color filters for a color electronic display. Also, separate donor sheets, each having multiple layer transfer layers, can be used to pattern different multilayer devices (e.g., OLEDs that emit different colors, OLEDs and OFETs that connect to form addressable pixels, etc.). A variety of other combinations of two or more thermal transfer elements can be used to form a device, each thermal transfer element forming one or more portions of the device. It will be understood other portions of these devices, or other devices on the receptor, may be formed in whole or in part by any suitable process including photolithographic processes, ink jet processes, and various other printing or mask-based processes.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described herein. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

A Perkin Elmer Lambda 900 UV-Vis-IR spectrometer or equivalent can be used to measure percent transmittance of layers at wavelengths such as 830 nm. The completeness of transfer of a colored transfer layer was measured by recording the change in absorbance between unimaged and images donor elements; e.g. at 440 nm wavelength for a donor element with a blue colored transfer layer. Suitable spectrometers for such color measurements are available from Ocean Optics, Dunedin, Fla.

The following ingredients were used to create the donor elements of the examples. Unless otherwise specified, all parts and percentages are by mass not volume.

Polymer dispersion PD2E is an aqueous dispersion of binder and crosslinker: about 37% of a copolymer of 48 mole % ethyl acrylate, 48 mole % methyl methacrylate, and 4 mole % methacrylamide; about 9% methylated melamine formaldehyde crosslinker with Chemical Abstracts Registry number [68002-20-0]; about 1% formaldehyde; about 3% methanol; and the remainder water.

Release-modifier KEP-DMAE was made in aqueous solution at 11.5% solids by adding concentrated aqueous potassium hydroxide to aqueous ethyl acid phosphate (Stauffer Chemicals, Westport, Conn.) to achieve a pH of about 4.5, followed by adding dimethyaminoethanol to achieve a pH of about 7.5.

Release-modifier Cyastat SP is a 35% solids solution of stearamidopropyldimethyl-β-hydroxyethylammonium dihydrogen phosphate [3758-54-1] in 50/50 isopropanol/water, available from Cytec Industries, West Paterson, N.J.

The release-modifiers Elfugin PF (containing a polyglycol ether substituted compound) and Elfugin AKT (containing a phosphate anion or ester compound) are available from Clariant Corporation, Charlotte, N.C. Elfugin PF is described in U.S. Pat. No. 5,059,579 as the product of polyethoxylation at 5 positions of tris(hydroxymethyl)aminomethane (TRIS, CAS [77-86-1]), so as to have up to five H(OCH2—CH2)n— chains (three from the distinct oxygens, and two from the single nitrogen), and such that the sum of the 5 "n" (degree of polymerization of polyethyleneoxide chains) is 5 to 100, and at least one of the H endcaps of the H(OCH2—CH2)n— are replaced by a CH2—CH(OH)—CH2Cl group.

Wetting agent WET2 is a polyether modified trisiloxane copolymer from Degussa, Hopewell, Va.

SDA4927 is 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid having CAS No. [162411-28-1], available from H. W. Sands Corp., Jupiter, Fla.

JONCRYL 63 is a 30% aqueous solution of JONCRYL 67, a styrene acrylic copolymer of number average molecular weight of 8200 and weight average molecular weight of 12000 available from Johnson Polymer, Sturtevant, Wis.

ZONYL® FSA is a 25% solids fluorosurfactant solution in a water iso-propanol blend, comprising RfCH2CH2SCH2CH2CO2Li where Rf=F(CF2CF2)x and where x is from 1 to about 9, available from E. I. du Pont de Nemours, Inc., Wilmington, Del.

AEROTEX 3730 is a 85% solids aqueous, fully water soluble, methylated melamine formaldehyde resin crosslinker, available from Cytec Industries, West Paterson, N.J.

In the examples given below, transfer layer thickness is about 1 to 2 microns.

Example 1

The following example provides an embodiment and use of a donor element having in order a conventional support layer, a light-to-heat conversion release-modifier layer that is conventionally coated on the support layer, and a transfer layer. The release-modifier layer includes a dissolved infrared light absorbing dye as light absorber.

Formulation 1 (HF1) was made by mixing in order 5290 parts water, 552.2 parts of PD2E, 2.5 parts WET2, 72.6 parts Cyastat SP, and then adjusting the pH of the formulation to 8.9 to 9.1 using 3% aqueous ammonium hydroxide and finally adding 66.09 parts SDA4927.

A 50 μm thick support layer of biaxially stretched polyester terephthalate film containing a blue dye to achieve 0.6 absorbance (25% transmission) at 670 nm was coated on the top side with HF1 using a wire wound rod and the formulation was dried at 50° C. for at least 5 minutes to give a combined release-modifier and light absorber layer transmitting 51.7% of light at 830 nm wavelength (an absorbance of 0.287). The resulting construct was termed Support Absorber 1 (SA1-IRM35).

Blue Formulation 1 (BF1) was made by combining 67.4 parts Blue Pigment Dispersion (49.3% non-volatile mass, pigment to binder mass ratio 2.0), 3.60 parts Violet pigment dispersion (25% non-volatile mass, pigment to binder mass ratio 2.3), 229.2 parts water, 90.8 parts JONCRYL 63, 2.4 parts aqueous ammonium hydroxide (3%), 1.4 parts ZONYL FSA, 1.20 parts SDA-4927, and 4 parts AEROTEX 3730.

BF1 was coated on the HF1 side of SA1-IRM35 using a wire wound rod and dried at 50° C. for at least 5 minutes to give a Blue Donor Element 1 (BDE1-IRM35).

A section of donor element BDE-1-IRM35 was combined with a glass color filter substrate having previously transferred red color pixels in a support-layer/release-modifier light-to-heat conversion layer/transfer layer/pixels/glass order to form an imageable assemblage. The imageable assemblage was imaged using a rapidly moving, blinking 830 nm infrared laser impinging on the support layer at a fluence of approximately 400 $mJ/cm^2$ and exposure time of less than 5 μs to transfer blue pixels suitable for a color filter having color values x=0.151, y=0.167, and Y=22.3, corresponding to 92% complete transfer of the colorant of the blue transfer layer.

Example 2

The following example provides an embodiment and use of a donor element having a release-modifier layer that is coated on a support layer precursor prior to transverse drawing in a stenter oven and subsequent heat setting.

A thick support layer of uniaxially stretched polyester terephthalate film containing a blue dye to achieve 0.6 absorbance at 670 nm over a 50 μm pathlength was coated on the top side with HF1 using a offset gravure coater, preheated to 90-100° C. for drying, drawn sideways to achieve a final thickness of 50 μm, and heat set to give a combined release-modifier and light absorber layer of 160 nm thickness transmitting 40% of light at 830 nm wavelength, having an absorbance of 0.398. The resulting construct was termed Support Absorber 2 (SA2-IRM35).

BF1 was coated on the HF1 side of SA2-IRM35 using a wire wound rod and dried at 50° C. for at least 5 minutes to give a Blue Donor Element 2(BDE2-IRM35).

A section of donor element BDE2-IRM35 was combined with a glass color filter substrate having previously transferred color pixels in a support-layer/release-modifier light-to-heat conversion layer/transfer layer/pixels/glass order to form an imageable assemblage. The imageable assemblage was imaged using a rapidly moving, blinking 830 nm laser impinging on the support layer at a fluence of approximately 400 $mJ/cm^2$ and exposure time of less than 5 μs to transfer blue pixels suitable for a color filter having color values x=0.151, y=0.150, and Y=19.32, corresponding to 98% complete transfer of the colorant of the blue transfer layer.

Comparative Example 3

The following comparative example provides a donor element closely comparable to Example 1, formulated without the release-modifier ingredient Cyastat-SP.

Release-modifier Formulation 2 (HF2) was made by mixing in order 4945 parts water, 1364 parts PD2E, 10 parts WET2, and then adjusting the pH of the formulation to 8.9 to 9.1 using 3% aqueous ammonium hydroxide and finally adding 3571 parts SDA-4927.

A 50 μm thick support layer of polyester terephthalate film containing a blue dye to achieve 0.6 absorbance at 670 nm was coated on the top side with HF1 using a wire wound rod and the formulation was dried at 50° C. for at least 5 minutes to give a light absorber layer transmitting 51.7% of light at 830 nm wavelength (an absorbance of 0.287). The resulting construct was termed Support Absorber 3 (SA3-IRM32A).

BF1 was coated on the HF2 side of SA3-IRM32A using a #2 wire wound rod and dried at 80° C. for 20 minutes to give a Blue Donor Element 3 (BDE3-IRM32A).

A section of donor element BDE3-IRM32A was combined with a glass color filter substrate having previously transferred color pixels in a support-layer/release-modifier light-to-heat conversion layer/transfer layer/pixels/glass order to form an imageable assemblage. The imageable assemblage was imaged using a rapidly moving 830 nm laser impinging on the support layer at a fluence of approximately 400 $mJ/cm^2$ and exposure time of less than 5 μs to transfer blue pixels suitable for a color filter having color values x=0.152, y=0.166, and Y=21.5, corresponding to 85.5% complete transfer of the colorant of the blue transfer layer.

Example 4

The following example provides an embodiment and use of a donor element having a release-modifier light-to-heat conversion layer comprising carbon black as the light absorbing material that is coated on a support layer precursor prior to stretching and heat setting.

Formulation 3 (HF3) was made by mixing in order 8290 parts water, 1364 parts of PD2E, 10 parts WET2, 179.3 parts Cyastat SP, and then adjusting the pH of the formulation to 8.9 to 9.1 using 3% aqueous ammonium hydroxide and finally adding 1814 parts of 25.7% non-volatile mass aqueous Carbon Black dispersion.

A polymer composition comprising unfilled polyethylene terephthalate was melt-extruded, cast onto a cooled rotating drum and stretched in the direction of extrusion to approximately 3 times its original length at a temperature of 75° C. The cooled stretched polymer composition was then coated on one side with HF3 to give a wet coating thickness of approximately 20 to 30 μm. HF3 was coated using an offset gravure coating arrangement, using a 60QCH gravure roll (Pamarco Technologies, Roselle, N.J.) rotated through the HF3 supply, taking HF3 onto the gravure roll surface. The gravure roll was rotated in the opposite direction to the polymer composition travel and the roll applied the coating at one point of contact.

The coated polymer composition was passed into a stenter oven at a temperature of 100-110° C. where the coated polymer composition was dried and stretched in the sideways direction to approximately 3 times its original width. The biaxially stretched coated polymer composition was heat-set at a temperature of about 190° C. by conventional means to yield a composite, in-line coated, support layer/light-to-heat absorber and release-modifier layer termed Support Absorber 4 SA4-IRM30. The total thickness of the Support Absorber 4 was 50 μm; dry thickness of the coating layer was about 0.5 to 0.9 μm. The absorbance of the Support Absorber 4 at 830 nm wavelength due to the coating was 0.28.

A conventional Red formulation 1 (RF1) was coated onto light-to-heat absorber and release-modifier layer of SA4-IRM30 to provide a red donor element (RDE4-IRM30).

A section of donor element RDE4-IRM30 was combined with a glass color filter substrate in a support-layer/release-modifier light-to-heat conversion layer/transfer layer/glass order to form an imageable assemblage. The imageable assemblage was imaged using a rapidly moving, blinking 830 nm infrared laser with output energy of 21.5 watts impinging on the support layer at a fluence of approximately 400 $mJ/cm^2$ and exposure time of less than 5 μs to transfer red pixels suitable for a color filter having color values x=0.559, y=0.331, and Y=26.7, corresponding to 84% complete transfer of the colorant of the red transfer layer.

Another section of donor element RDE4-IRM30 was combined with a glass color filter substrate having previously transferred color pixels in a support-layer/release-modifier light-to-heat conversion layer/transfer layer/pixels/glass order to form an imageable assemblage. The imageable assemblage was imaged using a rapidly moving, blinking 830 nm infrared laser with output energy of 21.5 watts impinging on the support layer at a fluence of approximately 400 $mJ/cm^2$ and exposure time of less than 5 μs to transfer red pixels suitable for a color filter having color values x=0.581, y=0.334, and Y=24.5, corresponding to 91% complete transfer of the thickness of the red transfer layer.

Example 5

The following example provides an embodiment and use of a donor element having a light-to-heat conversion layer comprising carbon black as light absorbing material, in a donor element that is free of release-modifier Cyastat SP. The light-to-heat conversion layer was coated on a support layer precursor prior to transverse drawing in a stenter oven and subsequent heat setting.

Formulation 4 (HF4) was made by mixing in order 7840 parts water, 1364 parts of PD2E, 10 parts WET2, and then adjusting the pH of the formulation to 8.9 to 9.1 using 3% aqueous ammonium hydroxide and finally adding 1814 parts of the Carbon Black dispersion.

HF4 was coated as for HF3 to give a composite in-line coated, support layer/light-to-heat absorber layer termed Support Absorber 5 (SA5-IRM33). The total thickness of the Support Absorber 5 was 50 μm, the absorbance of the Support Absorber 4 at 830 nm wavelength due to the coating was 0.27.

A conventional Red formulation 1 (RF1) was coated onto light-to-heat absorber layer of SA5-IRM33 to provide a red donor element (RDE5-IRM33).

A section of donor element RDE5-IRM33 was combined with a glass color filter substrate in a support-layer/light-to-heat conversion layer/transfer layer/glass order to form an imageable assemblage. The imageable assemblage was imaged using a rapidly moving, blinking 830 nm infrared laser with output energy of 21.5 watts impinging on the support layer at a fluence of approximately 400 $mJ/cm^2$ and exposure time of less than 5 μs to transfer red pixels suitable for a color filter having color values x=0.565, y=0.332, and Y=28.2, corresponding to 78% complete transfer of the thickness of the red transfer layer.

Another section of donor element RDE5-IRM33 was combined with a glass color filter substrate having previously transferred color pixels in a support-layer/release-modifier light-to-heat conversion layer/transfer layer/pixels/glass order to form an imageable assemblage. The imageable assemblage was imaged using a rapidly moving, blinking 830 nm infrared laser with output energy of 21.5 watts impinging on the support layer at a fluence of approximately 400 $mJ/cm^2$ and exposure time of less than 5 μs to transfer red pixels suitable for a color filter having color values x=0.583, y=0.335, and Y=25.6, corresponding to 84% complete transfer of the thickness of the red transfer layer.

Examples 6 to 14

The following examples provide comparative example(s) and example embodiments of a donor element having a light-to-heat conversion layer comprising a water dispersible sulphonated polyester binder, a dye capable of absorbing near IR laser radiation, and optionally a release-modifier or comparative material.

One hundred parts by weight of a light-to-heat conversion layer coating composition was made by taking about 72 parts of water, 1 part of dimethylaminoethanol, 0.95 parts SDA-4927, 13 parts of aqueous dispersed 30 mass percent sulphonated polyester (AmerTech polyester clear, having a glass transition temperature of 63 C and a minimum film forming temperature of 27 C), 4 parts isopropanol, 1 part substrate wetting additive (Tego WET 250, 93-96% solids polyether modified trisiloxane copolymer from Degussa, Hopewell, Va.), and optionally 0.16 parts of a release-modifier compound or comparative compound (that may be accompanied by water or other carrier). In the case of example 6, less water was used so that after application the support layer could be stretched to three times its original width to achieve a stretched light-to-heat conversion release-modifier layer with an transmittance at 830 nm of about 45%. In the other examples 7-14, the well-mixed light-to-heat conversion layer coating composition was coated using a #0 wire-wound rod on to a 50 micron polyester support layer to give a wet coated thickness of about 3 microns and a dried coating thickness of about 190 nm and a transmission of 830 nm wavelength light of about 45%. The resulting support layer/LTHC layer construction was coated on the LTHC layer side with a conventional blue pigmented transfer layer with a dry thickness of 1 to 2 microns to provide a donor element identified in the accompanying table.

A section of donor element was combined with a glass color filter substrate having red pixel elements in a support-layer/light-to-heat conversion layer/transfer layer/glass order to form an imageable assemblage. The imageable assemblage was imaged using a rapidly moving, blinking 830 nm infrared laser with six separately sampled output energies (nominally 14, 17, 18.5, 20, 21.5, and 23 watts) impinging on the support layer at a fluence of approximately 250-500 $mJ/cm^2$ and exposure time of less than 5 μs to transfer blue pixels suitable for a color filter.

The imaged assemblage was separated into a spent blue donor element and a glass color filter substrate having red and blue pixel elements. The spent donor element was analyzed calorimetrically for untransferred percentage of blue transfer layer in areas intended for 100% transfer, which value was subtracted from 100% to give the achieved transfer percentage. The blue pixel elements of the glass color filter substrate were analyzed colorimetrically for transferred line width (expressed as a percentage of intended imaged transfer width from the imaging laser use) and the color values of the transferred material (expressed in xyY coordinates of the CIE scale as a difference from the original donor element values). The thermal transfer process and the quality of the colors were assessed by measuring x, y and Y values for color coordinates in the CIE system in which x and y describe the hue of a color, and Y is a measure of the luminance (ratio of transmitted photons/incident photons).

The following Table 1 records the performance of the donor elements by imaging using various nominal levels of laser energy. The first column labeled "Example" assigns an identifier to each example. The second column labeled "Compound" designates the compound used as a candidate release-modifier (0.16 parts per 100 of coating composition). The third column labeled "Tr. % ave." designates the transferred percentage average (over the six nominal laser power settings) of blue transfer material that left the donor element and transferred to the receiver element. The fourth column labeled "Tr. % Max." designates the maximum transfer percent among the six nominal laser settings. The fifth column "Tr. % Delta" designates the spread of transferred amount within the six laser settings; the difference between the maximum and minimum value attained. The sixth through eighth columns record the same quantities for the achieved transferred width of the blue transferred material versus an intended transfer of about 90 microns in width as determined by the use of the laser pixels in the multiple pixel laser head. The ninth and tenth columns reflect transferred blue transfer material color in the xyY color space versus the xyY coordinates of the untransferred blue transfer materials. Thus, dy is the absolute difference in "y" coordinate in the xyY space for the untransferred and transferred blue transfer material. The average value of column nine is over the 6 laser wattages used. Similarly, the "dY ave." column 10 shows the Y (luminance) difference (dY) after transfer averaged over the 6 laser wattage settings.

TABLE 1

Performance of Donor Element Comprising a Compound

| Example | Compound | Tr. % ave. | Tr. % Max. | Tr. % Delta | Width % ave. | Width % Max. | Width % Delta | dy ave. | dY ave. |
|---|---|---|---|---|---|---|---|---|---|
| 6-0 | Stretched LTHC layer with K + EtOPO3H-DMAE | 91.41 | 93.11 | 3.35 | 96.47 | 98.6 | 6.0 | 0.028 | 2.701 |
| 7-1 | unstretched LTHC layer with K + EtOPO3H-DMAE | 96.63 | 97.71 | 3.19 | 97.6 | 101.8 | 9.6 | 0.04 | 6.563 |
| 8-9 | Cyastat-SP | 93.9 | 94.79 | 2.35 | 98.28 | 102.7 | 12.8 | 0.03 | 5.015 |
| 9-11 | Elfugin PF | 93.27 | 94.12 | 1.64 | 98.13 | 101.8 | 8.7 | 0.027 | 6.571 |
| 10-13 | Glycerol monooleate | 93.08 | 94.43 | 2.67 | 96.38 | 100.4 | 8.7 | 0.03 | 3.646 |
| 11-14 | Sorbitan monostearate | 93.26 | 93.95 | 1.38 | 98.07 | 101.4 | 12.9 | 0.029 | 3.934 |
| 12-7 | Lithium triflate | 86.96 | 89.82 | 4.29 | 96.47 | 99.1 | 6.9 | 0.033 | 7.918 |
| 13-6 | Polyvinyl alcohol | 91.61 | 92.9 | 3.15 | 99.28 | 101.8 | 5.9 | 0.025 | 5.958 |
| 14-3 | No compound | 94.62 | 95.82 | 3.35 | 98.65 | 104.5 | 23.79 | 0.027 | 6.015 |

Row 6-0 and 7-1, "K+EtOPO3H-DMAE", designates 0.16 grams solids basis (water free) of a blend of potassium ethylphosphate and dimethylaminoethanol derived from combination in three parts water of 0.5 parts ethyl acid phosphate (Stauffer Chemical Company, Westport, Conn.; Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water free compound.

Row 12-7, "Lithium triflate", reports on usage of lithium trifluoromethanesulfonate.

The following Table 2 records the performance of the donor elements by imaging using various nominal levels of laser energy. The first column labeled "Example" assigns an identifier to each example. The second column labeled "Compound" designates the compound used as a candidate release-modifier (0.16 parts per 100 of coating composition). The third column labeled "First Good" shows the lowest laser energy (over nine nominal laser power settings, from 11 watts to 23 watts by 1.5 watts) producing acceptable transfer of blue transfer material that left the donor element and transferred to the receiver element. The fourth column labeled "Last Good" shows the highest laser energy (over nine nominal laser power settings, from 11 watts to 23 watts by 1.5 watts) producing acceptable transfer of blue transfer material that left the donor element and transferred to the receiver element. The fifth column labeled "Tr, % at Last Good", shows the percentage of blue transfer layer that transferred to the receiver element using the laser energy at the level labeled "Last Good".

TABLE 2

| Performance Span of Donor Element Comprising a Compound | | | | |
|---|---|---|---|---|
| Example | Compound | First Good | Last Good | Tr, % at Last Good |
| 6-1 | K + EtOPO3H-DMAE | 12.5 | 23 | 95% |
| 7-9 | Cyastat-SP | 12.5 | 18.5 | 94% |
| 8-11 | Elfugin PF | 11 | 23 | 94% |
| 9-13 | Glycerol monooleate | 11 | 23 | 93% |
| 10-14 | Sorbitan monostearate | 11 | 23 | 100% |
| 11-7 | Lithium triflate | 12.5 | 23 | 99% |
| 12-6 | Polyvinyl alcohol | 12.5 | 23 | 90% |
| 13-3 | No compound | 17 | 20 | 93% |

What is claimed is:

1. A donor element for use in a thermal transfer process comprising:

a support layer formed by a stretching process;

a light-to-heat conversion layer disposed adjacent the support layer comprising a light absorber; and a transfer layer disposed adjacent the light-to-heat conversion layer opposite the support layer, after the stretching process, the transfer layer comprising a material capable of being image-wise transferred from the donor element to an adjacent receiver element when the donor element is selectively exposed to imaging light;

wherein the light-to-heat conversion layer is coated on the support layer prior to completion of the stretching process.

2. The donor element of claim 1, wherein the transfer layer is free of oriented organic emissive material and is free of oriented electronically active material.

3. The donor element of claim 1, wherein the light-to-heat conversion layer comprises a nitrocellulose.

4. The donor element of claim 1, wherein the light-to-heat conversion layer comprises a polymethylmethacrylate.

5. The donor element of claim 1, wherein the light-to-heat conversion layer comprises a polyalkylene carbonate.

6. The donor element of claim 1, wherein the light-to-heat conversion layer comprises a styrene-maleic copolymer.

7. The donor element of claim 1, wherein the light-to-heat conversion layer comprises a selection from the group polyvinyl alcohol, polyvinypyrrolidone, polysaccharide, poly(ethylene oxide), gelatin, polyhydroxyethyl cellulose and combinations thereof.

8. The donor element of claim 1, wherein the light absorber comprises a pigment.

9. The donor element of claim 1, wherein the light absorber comprises at least one of carbon black and graphite.

10. The donor element of claim 1, wherein the light absorber comprises a near-infrared dye.

11. The donor element of claim 1, wherein the light absorber is characterized by having at least one local absorption maximum between the wavelengths of 750 and 1200 nm.

12. The donor element of claim 1, wherein the light-to-heat conversion layer is characterized by having an absorbance maximum between the wavelengths of 650 and 1200 nm at least three times larger in magnitude than the highest absorbance of the light-to-heat conversion layer between the wavelengths of 400 and 650 nm.

13. The donor element of claim 1, wherein the light-to-heat conversion layer is free of both carbon black and graphite.

14. The donor element of claim 1, wherein the light-to-heat conversion layer is characterized by having an absorbance at a wavelength between 750 and 1200 nm that is larger than 0.2.

15. The donor element of claim 1, wherein the light-to-heat conversion layer is characterized by having a thickness of between 20 and 300 nm.

16. The donor element of claim 1, wherein the light absorber is selected from the group consisting of:

a) 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid having CAS No. [162411-28-1];

b) 2-[2-[2-(2-pyrimidinothio)-3-[2-(1,3-dihydro-1,1-dimethyl-3-(4-sulfobutyl)-2H-benz[e]indol-2-ylidene)]ethylidene-1-cyclopenten-1-yl]ethenyl]-1,1dimethyl-3-(4-sulfobutyl)-1H-benz[e]indolium, inner salt, sodium salt, having molecular formula C41H47N4Na1O6S3 and molecular weight of about 811 grams per mole;

c) indocyanine green, having CAS No. [3599-32-4];

d) 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; and e) combinations thereof.

17. The donor element of claim 1, wherein disposed between the support layer and the transfer layer is a release-modifier.

18. The donor element of claim 17, wherein the release-modifier is disposed in the light-to-heat conversion layer.

19. The donor element of claim 17, wherein the release-modifier is disposed in a layer between the transfer layer and the light-to-heat conversion layer.

20. The donor element of claim 17, wherein the release-modifier comprises between 0.1 and 90 mass percent of a layer disposed between the transfer layer and the support layer.

21. The donor element of claim 17, wherein the release-modifier comprises a quaternary ammonium cation comprising at least 4 and less than 80 carbon atoms.

22. The donor element of claim 17, wherein the release modifier comprises stearamidopropyldimethyl-β-hydroxy-ethylammonium cation.

23. The donor element of claim 17, wherein the release-modifier comprises a non-ionic compound comprising at least one ester group and from two to five hydroxyl groups.

24. The donor element of claim 17, wherein the release-modifier comprises: an anion comprising from 1 to 80 carbon atoms and at least one oxygen atom covalently bonded to a carbon atom and a phosphorous atom.

25. The donor element of claim 17, wherein the release-modifier comprises a poly([ethylene-propylene]oxide) substituted alcoholic compound comprising an amine.

26. The donor element of claim 17, wherein the release-modifier comprises a poly([ethylene-propylene]oxide) substituted alcoholic compound containing between 4 and 100 ethoxylate groups.

27. The donor element of claim 17, wherein:

the support layer and the light-to-heat conversion layer are free of any metallic layer and free of any metal oxide layer;

the light-to-heat conversion layer has a thickness of 20 to 300 nm, is free of carbon black and free of graphite, and has a local absorbance maximum larger than 0.2 at a wavelength between 750 and 1200 nm;

the light absorber comprises a near-infrared dye;

the release-modifier is disposed in the light-to-heat conversion layer and comprises a phosphorous compound; and the transfer layer comprises a pigment.

28. A method of making a donor element for use in a thermal transfer process comprising:

providing a support layer formed by a stretching process;

covering one side of the support layer with a light-to-heat conversion layer comprising a light absorber; and covering after the stretching process the light-to-heat conversion layer opposite the support layer with a transfer layer comprising a material capable of being image-wise transferred from the support layer to an adjacent receiver element when the light-to-heat conversion layer is selectively exposed to light;

wherein the covering step is performed prior to completion of the stretching process.

29. The method of claim 28, wherein the transfer layer is free of oriented organic emissive material and is free of oriented electronically active material.

30. The method of claim 28, wherein the light-to-heat conversion layer comprises a nitrocellulose.

31. The method of claim 28, wherein the light-to-heat conversion layer comprises a polymethylmethacrylate.

32. The method of claim 28, wherein the light-to-heat conversion layer comprises a polyalkylene carbonate.

33. The method of claim 28, wherein the light-to-heat conversion layer comprises a styrene-maleic copolymer.

34. The method of claim 28, wherein the light-to-heat conversion layer comprises a selection from the group polyvinyl alcohol, polyvinypyrrolidone, polysaccharide, poly(ethylene oxide), gelatin, polyhydroxyethyl cellulose and combinations thereof.

35. The method of claim 28, wherein the light absorber comprises a pigment.

36. The method of claim 28, wherein the light absorber comprises at least one of carbon black and graphite.

37. The method of claim 28, wherein the light absorber comprises a near-infrared dye.

38. The method of claim 28, wherein the light absorber is characterized by having at least one local absorption maximum between the wavelengths of 750 and 1200 nm.

39. The method of claim 28, wherein the light-to-heat conversion layer is characterized by having an absorbance maximum between the wavelengths of 650 and 1200 nm at least three times larger in magnitude than the highest absorbance of the light-to-heat conversion layer between the wavelengths of 400 and 650 nm.

40. The method of claim 28, wherein the light-to-heat conversion layer is free of both carbon black and graphite.

41. The method of claim 28, wherein the light-to-heat conversion layer is characterized by having an absorbance at a wavelength between 750 and 1200 nm that is larger than 0.2.

42. The method of claim 28, wherein the light-to-heat conversion layer is characterized by having a thickness of between 20 and 300 nm.

43. The method of claim 28, wherein the light absorber is selected from the group consisting of:

f) 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid having CAS No. [162411-28-1];

g) 2-[2-[2-(2-pyrimidinothio)-3-[2-(1,3-dihydro-1,1-dimethyl-3-(4-sulfobutyl)-2H-benz [e]indol-2-ylidene)]ethylidene-1-cyclopenten-1-yl]ethenyl]-1,1dimethyl-3-(4-sulfobutyl)-1H-benz[e]indolium, inner salt, sodium salt, having molecular formula C41H47N4Na1O6S3 and molecular weight of about 811 grams per mole;

h) indocyanine green, having CAS No. [3599-32-4];

i) 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; and j) combinations thereof.

44. The method of claim 28, wherein disposed between the support layer and the transfer layer is a release-modifier.

45. The method of claim 44, wherein the release-modifier is disposed in the light-to-heat conversion layer.

46. The method of claim 44, wherein the release-modifier is disposed in a layer between the transfer layer and the light-to-heat conversion layer.

47. The method of claim 44, wherein the release-modifier comprises between 0.1 and 90 mass percent of a layer disposed between the transfer layer and the support layer.

48. The method of claim 44, wherein the release-modifier comprises a quaternary ammonium cation comprising at least 4 and less than 80 carbon atoms.

49. The method of claim 44, wherein the release modifier comprises stearamidopropyldimethyl-β-hydroxyethylammonium cation.

50. The method of claim 44, wherein the release-modifier comprises a non-ionic compound comprising at least one ester group and from two to five hydroxyl groups.

51. The method of claim 44, wherein the release-modifier comprises: an anion comprising from 1 to 80 carbon atoms and at least one oxygen atom covalently bonded to a carbon atom and a phosphorous atom.

52. The method of claim 44, wherein the release-modifier comprises a poly([ethylene-propylene]oxide) substituted alcoholic compound comprising an amine.

53. The method of claim 44, wherein the release-modifier comprises a poly([ethylene-propylene]oxide) substituted alcoholic compound containing between 4 and 100 ethoxylate groups.

54. The method of claim 44, wherein:

the support layer and the light-to-heat conversion layer are free of any metallic layer and free of any metal oxide layer;

the light-to-heat conversion layer has a thickness of 20 to 300 nm, is free of carbon black and free of graphite, and has a local absorbance maximum larger than 0.2 at a wavelength between 750 and 1200 nm;

the light absorber comprises a near-infrared dye;

the release-modifier is disposed in the light-to-heat conversion layer and comprises a phosphorous compound; and the transfer layer comprises a pigment.

55. A method of using a donor element in a thermal transfer process to form an image comprising:

providing an assemblage of a donor element and a receiver element, the donor element comprising:

a. a support layer formed by a stretching process;

b. a light-to-heat conversion layer disposed adjacent one side of the support layer, the light-to-heat conversion layer comprising a light absorber; and c. a transfer layer disposed adjacent the light-to-heat conversion layer opposite the support layer after the stretching process, the transfer layer disposed between the light-to-heat conversion layer and the receiver element;

image-wise exposing the assemblage to light whereby at least a portion of the image-wise exposed transfer layer is transferred to the receiver element to form an image; and separating the donor element from the receiver element, thereby revealing the image on the receiver element;

wherein the light-to-heat conversion layer is coated on the support layer prior to completion of the stretching process.

56. The method of claim 55, wherein the light is provided by a laser having an energy output maximum at a wavelength between 650 and 1200 nm.

57. The method of claim 55, wherein the light is provided by a laser having an energy output maximum at a wavelength between 650 and 800 nm.

58. The method of claim 55, wherein the light is provided by a laser having an energy output maximum at a wavelength between 800 and 900 nm.

59. The method of claim 55, wherein the light is provided by a laser having an energy output maximum at a wavelength between 900 and 1200 nm.

60. The method of claim 55, wherein the transferred portion comprises an intact volume of the transfer layer.

61. The method of claim 55, wherein the transferred portion comprises an intact volume of the transfer layer, the light is provided by a laser having an energy output maximum at a wavelength between 650 and 1200 nm, the light-to-heat conversion layer comprises the release-modifier, the transfer layer comprises a pigment, and the release-modifier comprises phosphorous.

62. The method of claim 55, wherein the light is 40 to 80% transmitted by the light-to-heat conversion layer during the imaging exposure.

63. The method of claim 55, wherein the light is 30 to 70% transmitted by the light-to-heat conversion layer during the imaging exposure.

64. The method of claim 55, wherein the light-to-heat conversion layer comprises a nitrocellulose.

65. The method of claim 55, wherein the light-to-heat conversion layer comprises a polymethylmethacrylate.

66. The method of claim 55, wherein the light-to-heat conversion layer comprises a polyalkylene carbonate.

67. The method of claim 55, wherein the light-to-heat conversion layer comprises a styrene-maleic copolymer.

68. The method of claim 55, wherein the light-to-heat conversion layer comprises a selection from the group polyvinyl alcohol, polyvinypyrrolidone, polysaccharide, poly(ethylene oxide), gelatin, polyhydroxyethyl cellulose and combinations thereof.

* * * * *